United States Patent
Petropoulos et al.

(10) Patent No.: US 6,788,057 B1
(45) Date of Patent: Sep. 7, 2004

(54) OPEN ARCHITECTURE GRADIENT COIL SET FOR MAGNETIC RESONANCE IMAGING APPARATUS

(75) Inventors: Labros S. Petropoulos, Solon, OH (US); Mark Xueming Zou, Aurora, OH (US); Joseph Murphy-Boesch, Aurora, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/080,730

(22) Filed: Feb. 22, 2002

Related U.S. Application Data
(60) Provisional application No. 60/270,960, filed on Feb. 22, 2001.

(51) Int. Cl.[7] .................................................. G01V 3/00
(52) U.S. Cl. ....................................... 324/318; 324/309
(58) Field of Search ................................. 324/318, 309, 324/314, 307

(56) References Cited

U.S. PATENT DOCUMENTS

| | | | |
|---|---|---|---|
| 4,926,125 A | | 5/1990 | Roemer ....................... 324/318 |
| 5,036,282 A | | 7/1991 | Morich et al. ............... 324/318 |
| 5,497,089 A | * | 3/1996 | Lampman et al. ........... 324/318 |
| 5,581,187 A | | 12/1996 | Pausch ......................... 324/318 |
| 5,977,771 A | | 11/1999 | Petropoulos ................. 324/318 |
| 6,144,204 A | | 11/2000 | Sementchenko ............. 324/318 |
| 6,154,110 A | | 11/2000 | Takeshima ................... 324/318 |
| 6,563,315 B1 | * | 5/2003 | Boskamp et al. ............ 324/318 |

OTHER PUBLICATIONS

Bushong, Stewart C. Magnetic Resonance Imaging Physical and Biological Principles Second Edition. Textbook 1996 pp. 146, 147 and 152–155.*

Z.H. Cho and J.H. Yi, "Planar Surface Gradient Coil" Concepts in Magnetic Resonance, 1995, vol. 7(2), pp. 95–114.

Labros S. Petropoulos, "Phased Array Planar Gradient Sets for MRI systems with Vertical directed fields.", 2000, Proc. Intl. Soc. Mag. Reson. Med. 8 (2000), p. 333.

L.S. Petropoulos, J.L. Patrick, M.A. Morich, R.W. Brown, M.R. Thompson, "Actively Shielded Orthogonal Gradient Coils for Wrist Imaging", Dated: At least as early as Feb. 21, 2002, p. 1309.

L.S. Petropoulos, "Actively Shielded Biplanar Gradient Set for Open Magnet Geometries with Vertically Directed Fields.", Dated: At least as early as Feb. 21, 2002, p. 942.

* cited by examiner

Primary Examiner—Diego Gutierrez
Assistant Examiner—Tiffany A. Fetzner
(74) Attorney, Agent, or Firm—Michael A. Della Penna; Armstrong Teasdale, LLP

(57) ABSTRACT

A MRI gradient coil set includes a uniplanar Z-gradient coil, a biplanar X-gradient coil, and a biplanar Y-gradient coil. The coil set provides an open Z-axis face.

19 Claims, 12 Drawing Sheets

PRIMARY COIL: REGULAR
BIPLANAR Y GRADIENT PATTERN

PRIMARY COIL: PARABOLIC CUT-OFFS FOR THE
BIPLANAR Y GRADIENT PATTERN

SECONDARY COIL: REGULAR
BIPLANAR Y GRADIENT PATTERN

SECONDARY COIL: PARABOLIC CUT-OFFS FOR THE
BIPLANAR Y GRADIENT PATTERN

_US 6,788,057 B1_

OPEN ARCHITECTURE GRADIENT COIL SET FOR MAGNETIC RESONANCE IMAGING APPARATUS

CROSS-REFERENCE TO RELATED APPLICATION

This application claims the benefit of U.S. provisional patent application Ser. No. 60/270,960 filed Feb. 22, 2001.

BACKGROUND OF THE INVENTION

The present invention relates to magnetic resonance imaging and, in particular, to gradient coils used therewith.

A Magnetic Resonance Scanner where the direction of the main static field is orthogonal to the pole surface and to the magnet's main symmetry plane is commonly called an Open Magnet System.

Previous methods for production of linear magnetic gradients in such MRI systems consist of winding discrete coils, in a bunched or distributed fashion on an electrically insulating hollow right cylinder coil-form, and driving said coil with a limited voltage. Conventional bunched coil designs are the Maxwell and Modified Maxwell Pair for the Z-gradient coil (parallel to the main magnetic filed), and the Golay or Modified Golay (multi-arc) Saddle coils for the X/Y gradient coils. Previous methods consisted of iteratively placing elemental loops or arcs on the cylindrical coil form until the desired gradient strength, gradient uniformity and inductance were achieved. In general, these types of designs constituted as method referred as a "forward approach" whereby a set of initial coil positions (i.e. initial current distribution) were defined. The gradient field, the energy/inductance were calculated and if they did not fall within specified design criteria, the positions of the coils will be shifted (statistically or otherwise) and the new outcome will be re-evaluated. This iterative procedure will continue until a suitable solution that satisfies all the design criteria is found.

An alternative approach in the design of gradient coils is referred as an "inverse approach". According to this methodology, a set of predetermined constraint points for the gradient magnetic field is chosen inside the desired imaging volume. Via a Lagrange minimization technique involving the stored magnetic energy or power of the structure, the appropriate continuous current distribution that generates the predetermined gradient field inside the imaging volume is derived. Using a stream function discretization technique, the continuous current distribution of the coil can be approximated by a set of discrete current loops that are connected in series and share the same constant current. In order to ensure that the discretization process is valid, the gradient field is regenerated using the Biot-Savart law to the discrete current distribution and compare the results with the ones of the analytic approach. If the error is relatively small, the discrete current distribution is accepted as a valid one.

Open magnet geometries with vertically directed fields have been a successful presence in the MRI arena due to the inherent open architecture scheme that promotes patient comfort and diminishes patient claustrophobia. Recently, vertical field systems with higher main field strengths (0.5 T to 1.0 T) were also introduced in an attempt to improve image quality, as well as to expand the spectrum of clinical applications, especially fast imaging techniques not available on lower field strength MR scanners. The necessity for utilizing such imaging techniques is strongly dependent upon the availability of a suitable gradient system capable of delivering high gradient field strengths with a significant improvement to the gradient coil's slew rate. For open magnet geometries with vertically directed fields, biplanar gradient coils have been the geometry of choice, since there are conformed to the main magnet's geometric shape and assist in improving patient comfort and reducing patient claustrophobia. There is however a drawback in regards to the biplanar designs. Because of the demand that the coil must have enough gap to allow for clear access to the human torso, the distance between the two planes is excessively high. Increasing the gap between the two planes reduces the efficiency of the biplanar gradient in a level. Thus for a whole body gradient coil set, it is very difficult to generate gradient fields of the order of 50–60 mT/m with slew rates approaching 1000 T/m/sec. An alternative solution to this issue is the introduction of uniplanar gradient coil designs, which offer superb gradient field characteristics over a very limited imaging volume. Uniplanar gradients are mainly utilized on local imaging applications and are not recommended for applications with sizable FOV such as the one covering the human head. One viable alternative for performing ultra fast imaging of the human head for a vertical field system is the use of insertable biplanar gradients in a very close proximity to the human head. Due to the reduction of the gap between the planes the efficiency of the coil is significantly improved, and such a design is capable of generating high peak and high uniformity gradient fields over a volume similar to the size of the human head (25 cm DSV). But such a design is prohibitive because it violates the two principles of which the open magnet designs are based on. Placing the two planes over the human head and especially over the patient's eyes, it compromises the patient's comfort and enhances patient anxiety.

Gradient coil sets in common use make serious tradeoffs between coil performance and maintaining the "open," non-claustrophobic configuration, desired in open MRI systems.

SUMMARY OF THE INVENTION

A MRI gradient coil set includes a uniplanar Z-gradient coil, a biplanar X-gradient coil, and a biplanar Y-gradient coil. The coil set provides an open Z-axis face.

DESCRIPTION OF THE PREFERRED EMBODIMENTS

In this invention, a new alternative design for an insertable open architecture gradient coil set is given which is focused on enhancing patient comfort and abolishing patient anxiety, while delivering a gradient field with high peak strength and improved slew rate. According to this architecture, the Z gradient coil is a uniplanar design that is placed in parallel with the main magnet's poles. In order to form a complete gradient set, the two transverse (X, Y) gradients are generated by a pair of biplanar designs which are placed perpendicular to the magnets poles, but they may be physically mounted on the same side with the uniplanar Z gradient. The gradient field generated from the two transverse coils exhibits similar peak and slew rate performances as the uniplanar Z gradient coil over a comparable imaging volume. When this coil is designated for head imaging applications, parabolic cut-offs on the two side transverse biplanar coils may be implemented in a symmetric fashion. Such an insertable coil design does not disrupt the vision of the human subject and thus makes it more patient friendly without imposing restriction on the field strength and quality. The proposed design can also be implemented in a self-shielded configuration for reduction of induced eddy current effects on the vicinity of the main magnet's poles. In addition, the proposed design can be paired with an additional set of gradient coils (shielded or not) in an array configuration with a capability of extending the imaging coverage of the gradient coil system, while improving patient comfort and diminishing patient claustrophobia.

Theory

Figure 1:
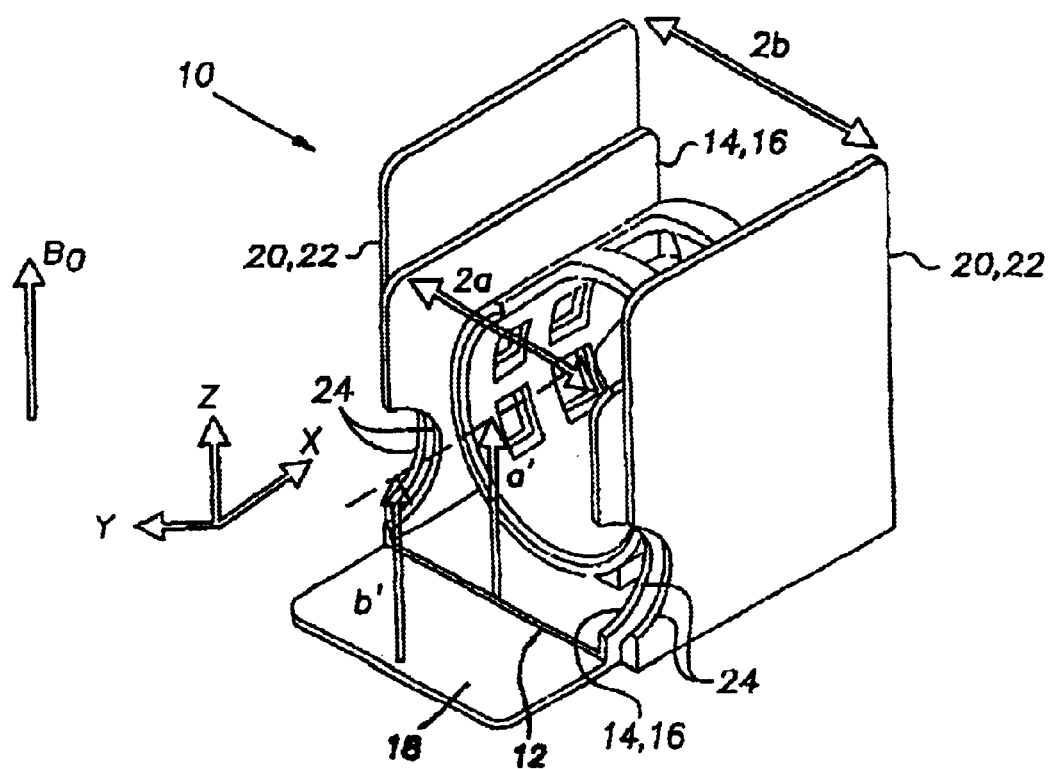
FIG. 1 is a perspective view of a possible gradient coil set according to the invention.

FIG. 1, shows the geometrical shape for a self-shielded open architecture gradient set. The gap between the two primary planes on the biplanar section of the coil is denoted as 2a while the distance between the shielding planes of the biplanar section of the coil is denoted as 2b. For the uniplanar section of the coil, the distance between the plane section of the coil and the geometric center of the coil is denoted as a', while the distance between the geometric center of the coil and shielding part of the biplanar section as b'. The schematic representation of a head Transmit/Receive Radio frequency coil is also included.

Axial (Z) Uniplanar Gradient

Let us assume that the position of the plane for the primary gradient coil is at z=−a' from the geometric center of the coil, while the position of the shielding coil is z=−b' from the center of the coil. The current density distribution for this design is confined on the xy plane and has the expression:

$$\vec{J}(x,y) = [J_x(x,y)\hat{x} + J_y(x,y)\hat{y}] \tag{1}$$

In addition the expression for the vector potential is given by:

$$A_x = \frac{\mu_0}{8\pi^2} \int\int_{-\infty}^{+\infty} d\alpha d\beta \frac{1}{\sqrt{\alpha^2+\beta^2}} e^{i\alpha x + i\beta y} \left[ e^{\sqrt{\alpha^2+\beta^2}(Z+a')} J_x^{-a'}(\alpha,\beta) + e^{\sqrt{\alpha^2+\beta^2}(Z+b')} J_x^{-b'}(\alpha,\beta) \right] \text{ for } z \geq -a' \tag{2}$$

$$A_y = \frac{\mu_0}{8\pi^2} \int\int_{-\infty}^{+\infty} d\alpha d\beta \frac{1}{\sqrt{\alpha^2+\beta^2}} e^{i\alpha x + i\beta y} \left[ e^{\sqrt{\alpha^2+\beta^2}(Z+a')} J_y^{-a'}(\alpha,\beta) + e^{\sqrt{\alpha^2+\beta^2}(Z+b')} J_y^{-b'}(\alpha,\beta) \right] \text{ for } z \geq -a' \tag{3}$$

And for the region outside the planes z≤−b', the expression for the vector potential is:

$$A_x = \frac{\mu_0}{8\pi^2} \int\int_{-\infty}^{+\infty} d\alpha d\beta \frac{1}{\sqrt{\alpha^2+\beta^2}} e^{i\alpha x + i\beta y} \left[ e^{\sqrt{\alpha^2+\beta^2}(Z+a')} J_x^{-a'}(\alpha,\beta) + e^{\sqrt{\alpha^2+\beta^2}(Z+b')} J_x^{-b'}(\alpha,\beta) \right] \text{ for } z \leq -b' \tag{4}$$

$$A_y = \frac{\mu_0}{8\pi^2} \int\int_{-\infty}^{+\infty} d\alpha d\beta \frac{1}{\sqrt{\alpha^2+\beta^2}} e^{i\alpha x + i\beta y} \left[ e^{\sqrt{\alpha^2+\beta^2}(Z+a')} J_y^{-a'}(\alpha,\beta) + e^{\sqrt{\alpha^2+\beta^2}(Z+b')} J_y^{-b'}(\alpha,\beta) \right] \text{ for } z \leq -b' \tag{5}$$

where $J_{(x,y)}(\alpha,\beta)$ represent the double Fourier Transform of $J_{(x,y)}(x,y)$, respectively. Since there is no charge free in the vicinity of the gradient coils, the application of the current continuity equation ($\nabla \cdot J = 0$) leads to a relationship between the components of the current density as:

$$J_y(\alpha,\beta) = -\frac{\alpha}{\beta} J_x(\alpha,\beta) \tag{6}$$

From equations (2)–(5) and equation (6), the expression for the vector potential at the location of the two planes is given by:

$$A_x = \frac{\mu_0}{8\pi^2} \int\int_{-\infty}^{+\infty} d\alpha d\beta \frac{1}{\sqrt{\alpha^2+\beta^2}} e^{i\alpha x + i\beta y} \left[ J_x^{-a'}(\alpha,\beta) + e^{\sqrt{\alpha^2+\beta^2}(b'-a')} J_x^{-b'}(\alpha,\beta) \right] \text{ for } z = -a' \tag{7}$$

$$A_y = \frac{\mu_0}{8\pi^2} \int\int_{-\infty}^{+\infty} d\alpha d\beta \frac{1}{\sqrt{\alpha^2+\beta^2}} e^{i\alpha x + i\beta y} \left(-\frac{\alpha}{\beta}\right) \left[ J_x^{-a'}(\alpha,\beta) + e^{\sqrt{\alpha^2+\beta^2}(b'-a')} J_x^{-b'}(\alpha,\beta) \right] \text{ for } z = -a' \tag{8}$$

$$A_x = \frac{\mu_0}{8\pi^2} \int\int_{-\infty}^{+\infty} d\alpha d\beta \frac{1}{\sqrt{\alpha^2+\beta^2}} e^{i\alpha x + i\beta y} \left[ e^{\sqrt{\alpha^2+\beta^2}(b'-a')} J_x^{-a'}(\alpha,\beta) + J_x^{-b'}(\alpha,\beta) \right] \text{ for } z = -b' \tag{9}$$

-continued $$A_y = \frac{\mu_0}{8\pi^2} \int\int_{-\infty}^{+\infty} d\alpha d\beta \frac{1}{\sqrt{\alpha^2+\beta^2}} e^{i\alpha x + i\beta y}\left(-\frac{\alpha}{\beta}\right)\left[e^{\sqrt{\alpha^2+\beta^2}\,(b'-a')} J_x^{-a'}(\alpha,\beta) + J_x^{-b'}(\alpha,\beta)\right] \text{ for } z = -b' \quad (10)$$

The expression for the magnetic field is:

$$B_x = -\partial_z A_y = \frac{i\mu_0}{8\pi^2}\int\int_{-\infty}^{+\infty} d\alpha d\beta \frac{\sqrt{\alpha^2+\beta^2}}{\beta} e^{i\alpha x + i\beta y} e^{-\sqrt{\alpha^2+\beta^2}\,(z+a')} J_x^{-a'}(\alpha,\beta)\left[1 - e^{-2\sqrt{\alpha^2+\beta^2}\,(b'-a')}\right] \text{ for } z \geq a' \quad (11)$$

and since the magnetic field is symmetric along the x and y directions and monotonically increased along the z direction, equation (11) becomes:

$$B_z = -\frac{\mu_0}{8\pi^2}\int\int_{-\infty}^{+\infty} d\alpha d\beta \frac{\sqrt{\alpha^2+\beta^2}}{\beta}\cos(\alpha x)\cos(\beta y)e^{\sqrt{\alpha^2+\beta^2}\,(z+a')}\hat{J}_x^{-a'}(\alpha,\beta)\left[1 - e^{-2\sqrt{\alpha^2+\beta^2}\,(b'-a')}\right] \text{ with} \quad (12)$$

$$J_x^{-b'}(\alpha,\beta) = -e^{\sqrt{\alpha^2+\beta^2}\,(b'-a')} J_x^{-a'}(\alpha,\beta)\text{(shielding condition } B_z = 0 \text{ for } z \geq b') \text{ and} \quad (13)$$

$$J_x^{-a'}(\alpha,\beta) = i\hat{J}_x^{-a'}(\alpha,\beta) \Rightarrow \hat{J}_x^{-a'}(\alpha,\beta) = 4\int\int_0^\infty dx dy \, \cos(\alpha x)\sin(\beta y) J_x^{-a'}(x,y) \quad (14)$$

Furthermore, the expression of the stored magnetic energy is:

$$W_M = \frac{1}{2}\int_V d^3\vec{x}\,\vec{A}\cdot\vec{J} = \frac{\mu_0}{16\pi^2}\int\int_{-\infty}^{+\infty} d\alpha d\beta \frac{\sqrt{\alpha^2+\beta^2}}{\beta}|J_x^{-a'}(\alpha,\beta)|^2\left[1 - e^{-2\sqrt{\alpha^2+\beta^2}\,(b'-a')}\right] \quad (15)$$

In order to find the optimum continuous current density, which will generate a gradient magnetic field in predetermined locations inside the imaging volume, can be extracted via a Lagrange optimization technique, According to this technique, a functional expression, which is a quadratic function of the current density is constructed. An example of such an expression includes which includes the stored magnetic energy and the magnetic field, and can have the form:

$$F(J_x^{-a'}) = W_m - \sum_{j=1}^N \lambda_j[B_z(\vec{r}_j) - B_{zsc}(\vec{r}_j)] \quad (16)$$

where $\lambda_j$ are the Lagrange multipliers and $B_{zsc}(r_j)$ are the constrained values of the magnetic field inside the desired imaging volume. Minimizing F with respect to $J_x^{-a'}$, a linear matrix equation for $J_x^{-a'}$ is obtained:

$$J_x^{-a'} = -\beta\sum_{j=1}^N \lambda_j\cos(\alpha x_j)\cos(\beta y_j)e^{-\sqrt{\alpha^2+\beta^2}\,(z_j+a')} \quad (17)$$

and the Lagrange multipliers are determined via the constrained equation:

$$\sum_{j=1}^N C_{ij}\lambda_j = B_{zSC_i} \Rightarrow C_{ij} = \quad (18)$$

$$\frac{\mu_0}{2\pi^2}\int\int^{+\infty} d\alpha d\beta \cos(\alpha x_i)\cos(\beta y_i)e^{-\sqrt{\alpha^2+\beta^2}\,(z_i+a')}$$

$$\sum_{j=1}^N \lambda_j\cos(\alpha x_j)\cos(\beta y_j)e^{-\sqrt{\alpha^2+\beta^2}\,(z_j+a')}\left[1 - e^{-2\sqrt{\alpha^2+\beta^2}\,(b'-a')}\right]$$

For the case of a non-shielded uniplanar axial gradient set, the above expressions are the same at the limit when b'→∞.

From the continuous current distribution and using employing the stream function technique, a discrete set of loops that closely approximates the continuous current density pattern is generated. In order to verify the accuracy of the discretization, the gradient field of the coil is re-evaluated by applying the Biot-Savart law to the discrete current distribution.

Transverse X or Y Uniplanar Gradient
The magnetic field is from equation (11):

$$B_z = -\partial_z A_y = \frac{i\mu_0}{8\pi^2}\int\int_{-\infty}^{+\infty} d\alpha d\beta \frac{\sqrt{\alpha^2+\beta^2}}{\beta} e^{i\alpha x+i\beta y} e^{\sqrt{\alpha^2+\beta^2}(z+a')} J_x^{-a'}(\alpha,\beta)\left[1-e^{-2\sqrt{\alpha^2+\beta^2}(b'-a')}\right] \text{ for } z \geq a'$$

and since the magnetic field is symmetric along the x and z directions and antisymmetric along the y direction, equation (11) becomes:

$$B_z = -\frac{\mu_0}{8\pi^2}\int\int_{-\infty}^{+\infty} d\alpha d\beta \frac{\sqrt{\alpha^2+\beta^2}}{\beta}\sin(\alpha x)\cos(\beta y)e^{\sqrt{\alpha^2+\beta^2}(z+a')}\hat{J}_x^{-a'}(\alpha,\beta)\left[1-e^{-2\sqrt{\alpha^2+\beta^2}(b'-a')}\right] \text{ with} \quad (12a)$$

$$J_x^{-b'}(\alpha,\beta) = -e^{\sqrt{\alpha^2+\beta^2}(b'-a')} J_x^{-a'}(\alpha,\beta)(\text{shielding condition: } B_z = 0 \text{ for } z \geq b') \text{ and} \quad (13a)$$

$$J_x^{-a'}(\alpha,\beta) = 4\int\int_0^\infty dx dy\, \sin(\alpha x)\sin(\beta y) J_x^{-a'}(x,y) \quad (14a)$$

Furthermore, the expression of the stored magnetic energy is:

$$W_M = \frac{1}{2}\int_V d^3\vec{x}\,\vec{A}\cdot\vec{J} = \frac{\mu_0}{16\pi^2}\int\int_{-\infty}^{+\infty} d\alpha d\beta \frac{\sqrt{\alpha^2+\beta^2}}{\beta}\left|J_x^{-a'}(\alpha,\beta)\right|^2\left[1-e^{-2\sqrt{\alpha^2+\beta^2}(b'-a')}\right] \quad (15a)$$

In order to find the optimum continuous current density, which will generate a gradient magnetic field in predetermined locations inside the imaging volume, can be extracted via a Lagrange optimization technique, According to this technique, a functional expression, which is a quadratic function of the current density is constructed. An example of such an expression includes which includes the stored magnetic energy and the magnetic field, and can have the form:

$$F(J_x^{-a'}) = W_m - \sum_{j=1}^N \lambda_j [B_z(\vec{r}_j) - B_{zsc}(\vec{r}_j)] \quad (16)$$

where $\lambda_j$ are the Lagrange multipliers and $B_{zsc}(r_j)$ are the constrained values of the magnetic field inside the desired imaging volume. Minimizing F with respect to $J_x^{-a'}$, a linear matrix equation for $J_x^{-a'}$ is obtained:

$$J_x^{-a'} = -\beta \sum_{j=1}^N \lambda_j \sin(\alpha x_j)\cos(\beta y_j) e^{-\sqrt{\alpha^2+\beta^2}(z_j+a')} \quad (17a)$$

and the Lagrange multipliers are determined via the constrained equation:

$$\sum_{j=1}^N C_{ij}\lambda_j = B_{zSC_i} \Rightarrow C_{ij} = \quad (18a)$$

$$\frac{\mu_0}{2\pi^2}\int\int^{+\infty} d\alpha d\beta \sin(\alpha x_i)\cos(\beta y_i) e^{-\sqrt{\alpha^2+\beta^2}(z_i+a')}$$

-continued $$\sum_{j=1}^N \lambda_j \sin(\alpha x_j)\cos(\beta y_j) e^{-\sqrt{\alpha^2+\beta^2}(z_j+a')}\left[1-e^{-2\sqrt{\alpha^2+\beta^2}(b'-a')}\right]$$

For the case of a non-shielded uniplanar axial gradient set, the above expressions are the same at the limit when $b' \to \infty$.

From the continuous current distribution and using employing the stream function technique, a discrete set of loops that closely approximates the continuous current density pattern is generated. In order to verify the accuracy of the discretization, the gradient field of the coil is re-evaluated by applying the Biot-Savart law to the discrete current distribution.

Phased Array considerations: Mutual energy between two coils.

Let us assume a second planar set with planes locations of $z=-a'$ and $z=-b'$. If the second set is shifted along the x or y directions or both by an amount of $x_0$ and $y_0$, respectively, the analytical expression of the current density distribution is given by:

$$J_x^{-a',-b'}(\alpha,\beta) = \quad (19)$$

$$e^{i\beta y_0} e^{i\alpha x_0}\int\int_{-\infty}^\infty dx dy\, e^{i\beta(y-y_0)} e^{i\alpha(x-x_0)} J_x^{-a',-b'}(x,y)$$

Considering for simplicity of the evaluations, that the second set is shifted only along the y direction by an amount of $y_0$. In this situation the mutual energy between these two modules is given by:

$$W_{Mutual} = \frac{1}{2}\int_V d^3\vec{x}\, \tilde{A}^{(-a',-b')}\cdot \vec{J}^{(-a',-b')} \quad (20)$$

-continued $$= \frac{\mu_0}{4\pi^2} \int\int_{-\infty}^{+\infty} d\alpha d\beta \frac{\sqrt{\alpha^2+\beta^2}}{\beta^2} e^{-i\beta y_0} J_x^{-a'}(\alpha,\beta) J_x^{-a'*}$$

$$(\alpha,\beta) e^{-\sqrt{\alpha^2+\beta^2}\,(a'-\overline{a}')} \left[1 - e^{-2\sqrt{\alpha^2+\beta^2}\,(b'-(a'-\overline{a}'))}\right]$$

If both planes represent the same gradient coil axis, equation (20) becomes $$W_{Mutual} = \frac{\mu_0}{4\pi^2} \int\int_{-\infty}^{+\infty} d\alpha d\beta \frac{\sqrt{\alpha^2+\beta^2}}{\beta^2} \cos(\beta y_0) J_x^{-a'}(\alpha,\beta) \quad (21)$$

$$J_x^{-a'*}(\alpha,\beta) \, e^{\sqrt{\alpha^2+\beta^2}\,(a'-\overline{a}')} \left[1 - e^{-2\sqrt{\alpha^2+\beta^2}\,(b'-(a'-\overline{a}'))}\right]$$

The optimum phased array configuration occurs at the $y_0$ points where the value of the mutual inductance between the two sets is minimized.

Transverse (X, Y) Biplanar Gradient Coils

Let us assume that for the self-shielded biplanar design, the gap between the two planes of the primary gradient coil is y=2a, while the gap between the planes of the shielding coil is z=2b. The current density distribution for either the primary gradient coil or the secondary gradient coil $$\vec{J}(x,y) = [J_x^{+a}(x,z)\hat{x} + J_z^{+a}(x,z)\hat{z}]\delta(y-a) + \quad (22)$$

$$[J_x^{-a}(x,z)\hat{x} + J_z^{-a}(x,z)\hat{z}]\delta(y+a) +$$

$$[J_x^{+b}(x,z)\hat{x} + J_z^{+b}(x,z)\hat{z}]\delta(y-b) +$$

$$[J_x^{-b}(x,z)\hat{x} + J_z^{-b}(x,z)\hat{z}]\delta(y+b)$$

is confined on the xz plane. The analytical expression for the current density of the coil is:

In addition the expression for the vector potential is given by:

where $J_{(x,y)}(\alpha,\beta)$ represent the double Fourier Transform of $J_{(x,z)}(x,z)$, respectively. Since there $$A_{x,z} = \frac{\mu_0}{8\pi^2}\int\int_{-\infty}^{+\infty} d\alpha d\beta \frac{1}{\sqrt{\alpha^2+\beta^2}} e^{i\alpha x+i\beta z}\left[\begin{array}{l}e^{\sqrt{\alpha^2+\beta^2}\,(a-y)}J_{x,z}^a(\alpha,\beta) + e^{\sqrt{\alpha^2+\beta^2}\,(a+y)}J_{x,z}^{-a}(\alpha,\beta) + \\ e^{\sqrt{\alpha^2+\beta^2}\,(b-y)}J_{x,z}^b(\alpha,\beta) + e^{\sqrt{\alpha^2+\beta^2}\,(b+y)}J_{x,z}^{-b}(\alpha,\beta)\end{array}\right] \text{ for } |y| \le a \quad (23)$$

$$A_{x,z} = \frac{\mu_0}{8\pi^2}\int\int_{-\infty}^{+\infty} d\alpha d\beta \frac{1}{\sqrt{\alpha^2+\beta^2}} e^{i\alpha x+i\beta z}\left[\begin{array}{l}e^{\sqrt{\alpha^2+\beta^2}\,(a-y)}J_{x,z}^a(\alpha,\beta) + e^{\sqrt{\alpha^2+\beta^2}\,(a+y)}J_{x,z}^{-a}(\alpha,\beta) + \\ e^{\sqrt{\alpha^2+\beta^2}\,(y-b)}J_{x,z}^b(\alpha,\beta) + e^{\sqrt{\alpha^2+\beta^2}\,(b+y)}J_{x,z}^{-b}(\alpha,\beta)\end{array}\right] \text{ for } |y| \le b \quad (24)$$

is no charge free in the vicinity of the gradient coils, the application of the current continuity equation ($\nabla \cdot \mathbf{J}=0$) leads to a relationship between the components of the current density as:

$$J_z(\alpha, \beta) = -\frac{\alpha}{\beta} J_x(\alpha, \beta) \tag{25}$$

From equations (23)–(24) and equation (25), the expression for the vector potential at the location of the two planes is given by:

$$A_x = \frac{\mu_0}{8\pi^2} \int\int_{-\infty}^{+\infty} \frac{d\alpha d\beta}{\sqrt{\alpha^2+\beta^2}} e^{i\alpha x + i\beta z} \left[ \begin{array}{l} J_x^a(\alpha,\beta) + e^{\sqrt{\alpha^2+\beta^2}\,(2a)} J_x^{-a}(\alpha,\beta) + \\ e^{\sqrt{\alpha^2+\beta^2}\,(b-a)} J_x^b(\alpha, \beta e^{\sqrt{\alpha^2+\beta^2}\,(b+a)} J_x^{-b}(\alpha,\beta) \end{array} \right] \text{ for } y=a \tag{26}$$

$$A_z = \frac{\mu_0}{8\pi^2} \int\int_{-\infty}^{+\infty} d\alpha d\beta \frac{1}{\sqrt{\alpha^2+\beta^2}} e^{i\alpha x + i\beta z} \left(-\frac{\alpha}{\beta}\right)\left[ \begin{array}{l} J_z^a(\alpha,\beta) + e^{\sqrt{\alpha^2+\beta^2}\,(2a)} J_z^{-a}(\alpha,\beta) + \\ e^{\sqrt{\alpha^2+\beta^2}\,(b-a)} J_z^b(\alpha, \beta e^{\sqrt{\alpha^2+\beta^2}\,(b+a)} J_z^{-b}(\alpha,\beta) \end{array} \right] \text{ for } y=a \tag{27}$$

$$A_z = \frac{\mu_0}{8\pi^2} \int\int_{-\infty}^{+\infty} d\alpha d\beta \frac{1}{\sqrt{\alpha^2+\beta^2}} e^{i\alpha x + i\beta z} \left[ \begin{array}{l} e^{\sqrt{\alpha^2+\beta^2}\,2a} J_x^a(\alpha,\beta) + J_x^{-a}(\alpha,\beta) + \\ e^{\sqrt{\alpha^2+\beta^2}\,(b+a)} J_x^b(\alpha,\beta) + e^{\sqrt{\alpha^2+\beta^2}\,(b-a)} J_x^{-b}(\alpha,\beta) \end{array} \right] \text{ for } y=-a \tag{28}$$

$$A_z = \frac{\mu_0}{8\pi^2} \int\int_{-\infty}^{+\infty} d\alpha d\beta \frac{1}{\sqrt{\alpha^2+\beta^2}} e^{i\alpha x + i\beta z} \left(-\frac{\alpha}{\beta}\right)\left[ \begin{array}{l} e^{\sqrt{\alpha^2+\beta^2}\,2a} J_z^a(\alpha,\beta) + J_z^{-a}(\alpha,\beta) + \\ e^{\sqrt{\alpha^2+\beta^2}\,(b+a)} J_z^b(\alpha,\beta) + e^{\sqrt{\alpha^2+\beta^2}\,(b-a)} J_z^{-b}(\alpha,\beta) \end{array} \right] \text{ for } y=-a \tag{29}$$

$$A_z = \frac{\mu_0}{8\pi^2} \int\int_{-\infty}^{+\infty} d\alpha d\beta \frac{1}{\sqrt{\alpha^2+\beta^2}} e^{i\alpha x + i\beta z} \left[ \begin{array}{l} e^{\sqrt{\alpha^2+\beta^2}\,(b-a)} J_x^a(\alpha,\beta) + e^{\sqrt{\alpha^2+\beta^2}\,(b+a)} J_x^{-a}(\alpha,\beta) + \\ J_x^b(\alpha,\beta) + e^{\sqrt{\alpha^2+\beta^2}\,(2b)} J_x^{-b}(\alpha,\beta) \end{array} \right] \text{ for } y=b \tag{30}$$

$$A_z = \frac{\mu_0}{8\pi^2} \int\int_{-\infty}^{+\infty} d\alpha d\beta \frac{1}{\sqrt{\alpha^2+\beta^2}} e^{i\alpha x + i\beta z} \left(-\frac{\alpha}{\beta}\right)\left[ \begin{array}{l} e^{\sqrt{\alpha^2+\beta^2}\,(b-a)} J_z^a(\alpha,\beta) + e^{\sqrt{\alpha^2+\beta^2}\,(b+a)} J_z^{-a}(\alpha,\beta) + \\ J_z^b(\alpha,\beta) + e^{\sqrt{\alpha^2+\beta^2}\,(2b)} J_z^{-b}(\alpha,\beta) \end{array} \right] \text{ for } y=b \tag{31}$$

$$A_z = \frac{\mu_0}{8\pi^2} \int\int_{-\infty}^{+\infty} d\alpha d\beta \frac{1}{\sqrt{\alpha^2+\beta^2}} e^{i\alpha x + i\beta z} \left[ \begin{array}{l} e^{\sqrt{\alpha^2+\beta^2}\,(b+a)} J_x^a(\alpha,\beta) + e^{\sqrt{\alpha^2+\beta^2}\,(b+a)} J_x^{-a}(\alpha,\beta) + \\ e^{\sqrt{\alpha^2+\beta^2}\,(2b)} J_x^b(\alpha,\beta) + J_x^{-b}(\alpha,\beta) \end{array} \right] \text{ for } y=b \tag{32}$$

$$A_z = \frac{\mu_0}{8\pi^2} \int\int_{-\infty}^{+\infty} d\alpha d\beta \frac{1}{\sqrt{\alpha^2+\beta^2}} e^{i\alpha x + i\beta z} \left(-\frac{\alpha}{\beta}\right)\left[ \begin{array}{l} e^{\sqrt{\alpha^2+\beta^2}\,(b+a)} J_z^a(\alpha,\beta) + e^{\sqrt{\alpha^2+\beta^2}\,(b+a)} J_z^{-a}(\alpha,\beta) + \\ e^{\sqrt{\alpha^2+\beta^2}\,(2b)} J_z^b(\alpha,\beta) + J_z^{-b}(\alpha,\beta) \end{array} \right] \text{ for } y=-b \tag{33}$$

The expression for the magnetic field is:

$$B_z = -\partial_z A_y = -\frac{\mu_0}{8\pi^2} \int\int_{-\infty}^{+\infty} d\alpha d\beta e^{i\alpha x + i\beta z} \left[ \begin{array}{l} e^{-\sqrt{\alpha^2+\beta^2}\,(a-y)} J_x^a(\alpha,\beta) - e^{-\sqrt{\alpha^2+\beta^2}\,(a+y)} J_x^{-a}(\alpha,\beta) + \\ e^{-\sqrt{\alpha^2+\beta^2}\,(b-y)} J_x^b(\alpha,\beta) - e^{-\sqrt{\alpha^2+\beta^2}\,(b+y)} J_x^{-b}(\alpha,\beta) \end{array} \right] \text{ for } |y| \leq a \tag{34}$$

$$B_z = -\partial_z A_y = -\frac{\mu_0}{8\pi^2} \int\int_{-\infty}^{+\infty} d\alpha d\beta e^{i\alpha x + i\beta z} \left[ \begin{array}{l} -e^{-\sqrt{\alpha^2+\beta^2}\,(y-a)} J_x^a(\alpha,\beta) + e^{\sqrt{\alpha^2+\beta^2}\,(a+y)} J_x^{-a}(\alpha,\beta) - \\ e^{-\sqrt{\alpha^2+\beta^2}\,(y-b)} J_x^b(\alpha,\beta) + e^{\sqrt{\alpha^2+\beta^2}\,(b+y)} J_x^{-b}(\alpha,\beta) \end{array} \right] \text{ for } |y| \geq b \tag{35}$$

Transverse Y Gradient Coil

For the Y gradient coil, the gradient magnetic field is symmetric along the x and z directions while it is asymmetric along the y direction. In this case the relationship between the current densities on the adjacent planes is:

$$J_x^a(\alpha,\beta) = J_x^{-a}(\alpha,\beta) \text{ and } J_x^b(\alpha,\beta) = J_x^{-b}(\alpha,\beta) \tag{4}$$

The expression of the magnetic field from equations (34) and (35) becomes:

$$B_z = -\frac{\mu_0}{8\pi^2}\int\int_{-\infty}^{+\infty} d\alpha d\beta e^{i\alpha x+i\beta z}\left[\begin{array}{l}J_x^a(\alpha,\beta)\left(e^{\sqrt{\alpha^2+\beta^2}\,(a-y)}-e^{\sqrt{\alpha^2+\beta^2}\,(a+y)}\right)+\\ J_x^b(\alpha,\beta)\left(e^{\sqrt{\alpha^2+\beta^2}\,(b-y)}-e^{\sqrt{\alpha^2+\beta^2}\,(b+y)}\right)\end{array}\right] \text{ for } |y|\le a \quad (36)$$

$$B_z = -\partial_z A_y = -\frac{\mu_0}{8\pi^2}\int\int_{-\infty}^{+\infty} d\alpha d\beta e^{i\alpha x+i\beta z}\left[\begin{array}{l}J_x^a(\alpha,\beta)\left(-e^{\sqrt{\alpha^2+\beta^2}\,(y-a)}+e^{\sqrt{\alpha^2+\beta^2}\,(a+y)}\right)-\\ J_x^b(\alpha,\beta)\left(-e^{\sqrt{\alpha^2+\beta^2}\,(y-b)}+e^{\sqrt{\alpha^2+\beta^2}\,(b+y)}\right)\end{array}\right] \text{ for } |y|\ge b \quad (37)$$

The gradient field shielding condition in the region outside both planes demands that $B_z=0$ for $|y|\ge b$. Equation (37) leads to:

$$J_x^{-b'}(\alpha,\beta) = -e^{\sqrt{\alpha^2+\beta^2}\,(b'-a')}J_x^{-a'}(\alpha,\beta) \text{ whichleads to:} \quad (38)$$

$$B_z = -\frac{\mu_0}{4\pi^2}\int\int_{-\infty}^{+\infty} d\alpha d\beta \cos(\alpha x)\cos(\beta z)e^{\sqrt{\alpha^2+\beta^2}\,a}\sinh\left(y\sqrt{\alpha^2+\beta^2}\right)J_x^a(\alpha,\beta)\left[1-e^{-2\sqrt{\alpha^2+\beta^2}\,(b-a)}\right] \quad (39)$$

and $$J_x^a(\alpha,\beta) = 4\int\int_0^\infty dx dz\, \cos(\alpha x)\cos(\beta y)J_x^a(x,z) \quad (40)$$

Employing the current density's symmetry conditions, the shielding condition and the continuity equation, the expression for the stored magnetic energy is given by:

$$W_M = \frac{1}{2}\int_V d^3\vec{x}\,\vec{A}\cdot\vec{J} \quad (41)$$

$$= \frac{\mu_0}{8\pi^2}\int\int_{-\infty}^{+\infty} d\alpha d\beta \frac{\sqrt{\alpha^2+\beta^2}}{\beta^2}|J_x^a(\alpha,\beta)|^2(1+e^{-2a\sqrt{\alpha^2+\beta^2}})\left[1-e^{-2\sqrt{\alpha^2+\beta^2}\,(b-a)}\right]$$

In order to find the optimum continuous current density, which will generate a gradient magnetic field in predetermined locations inside the imaging volume, can be extracted via a Lagrange optimization technique, According to this technique, a functional expression, which is a quadratic function of the current density is constructed. An example of such an expression includes which includes the stored magnetic energy and the magnetic field, and can have the form:

$$F(J_x^a) = W_m - \sum_{j=1}^N \lambda_j[B_z(\vec{r}_j) - B_{zsc}(\vec{r}_j)] \quad (42)$$

where $\lambda_j$ are the Lagrange multipliers and $B_{zsc}(r_j)$ are the constrained values of the magnetic field inside the desired imaging volume. Minimizing F with respect to $J_x^a$, a linear matrix equation for $J_x^a$ is obtained:

$$J_x^a = \frac{\beta^2}{\sqrt{\alpha^2+\beta^2}}\frac{e^{-a\sqrt{\alpha^2+\beta^2}}}{\left(1+e^{-2a\sqrt{\alpha^2+\beta^2}}\right)}\sum_{j=1}^N \lambda_j\, \cos(\alpha x_j)\cos(\beta z_j)\sinh\left(y_j\sqrt{\alpha^2+\beta^2}\right) \quad (43)$$

and the Lagrange multipliers are determined via the constrained equation:

$$\sum_{j=1}^N C_{ij}\lambda_j = B_{zsc} \Rightarrow C_{ij} = \quad (44)$$

$$\frac{\mu_0}{\pi^2}\int\int^{+\infty} d\alpha d\beta \cos(\alpha x_j)\cos(\beta z_j)\sinh\left(y_j\sqrt{\alpha^2+\beta^2}\right)$$

$$\frac{\beta^2}{\sqrt{\alpha^2+\beta^2}}\frac{e^{-a\sqrt{\alpha^2+\beta^2}}\,e^{-(b-a)\sqrt{\alpha^2+\beta^2}}}{\cosh\left(a\sqrt{\alpha^2+\beta^2}\right)}\sinh((b-a))$$

$$\sqrt{\alpha^2+\beta^2}\,)\sum_{j=1}^N \lambda_j\cos(\alpha x_j)\cos(\beta z_j)\sinh\left(y_j\sqrt{\alpha^2+\beta^2}\right)$$

And the expression for the stored energy is:

$$W_M = \frac{\mu_0}{\pi^2} \int\int_{-\infty}^{+\infty} d\alpha d\beta \frac{\beta^2}{\sqrt{\alpha^2+\beta^2}} \frac{e^{-b\sqrt{\alpha^2+\beta^2}}}{\cosh(a\sqrt{\alpha^2+\beta^2})} \sinh((b-a)\sqrt{\alpha^2+\beta^2})$$

$$\left(\sum_{j=1}^{N} \lambda_j \cos(\alpha x_j)\cos(\beta z_j)\sinh(y_j\sqrt{\alpha^2+\beta^2})\right)^2 \quad (45)$$

For the case of a non-shielded biplanar transverse gradient set, the above expressions are the same at the limit when $b \to \infty$.

From the continuous current distribution and using employing the stream function technique, a discrete set of loops that closely approximates the continuous current density pattern is generated. In order to verify the accuracy of the discretization, the gradient field of the coil is re-evaluated by applying the Biot-Savart law to the discrete current distribution.

Transverse X Gradient Coil

For the X gradient coil, the gradient magnetic field is symmetric along the y and z directions while it is asymmetric along the x direction. In this case the relationship between the current densities on the adjacent planes is:

$$J_x^a(\alpha,\beta) = -J_x^{-a}(\alpha,\beta) \text{ and } J_x^b(\alpha,\beta) = -J_x^{-b}(\alpha,\beta)$$

The expression of the magnetic field from equations (34) and (35) becomes:

$$B_z = -\frac{\mu_0}{8\pi^2}\int\int_{-\infty}^{+\infty} d\alpha d\beta e^{i\alpha x+i\beta z}\begin{bmatrix} J_x^a(\alpha,\beta)\left(e^{\sqrt{\alpha^2+\beta^2}(a-y)}+e^{\sqrt{\alpha^2+\beta^2}(a+y)}\right)+ \\ J_x^b(\alpha,\beta)\left(e^{\sqrt{\alpha^2+\beta^2}(b-y)}+e^{\sqrt{\alpha^2+\beta^2}(b+y)}\right) \end{bmatrix} \text{ for } |y| \le a \quad (46)$$

$$B_z = -\partial_z A_y = \frac{\mu_0}{8\pi^2}\int\int_{-\infty}^{+\infty} d\alpha d\beta e^{i\alpha x+i\beta z}\begin{bmatrix} J_x^a(\alpha,\beta)\left(-e^{\sqrt{\alpha^2+\beta^2}a}2\cosh(y\sqrt{\alpha^2+\beta^2})\right)- \\ J_x^b(\alpha,\beta)\left(-e^{-b\sqrt{\alpha^2+\beta^2}}2\cosh(y\sqrt{\alpha^2+\beta^2})\right) \end{bmatrix} \text{ for } |y| \ge b \quad (47)$$

The gradient field shielding condition in the region outside both planes demands that $B_z = 0$ for $|y| \ge b$. Equation (47) leads to:

$$J_x^{-b'}(\alpha,\beta) = -e^{\sqrt{\alpha^2+\beta^2}(b'-a')}J_x^{-a'}(\alpha,\beta) \quad (48)$$

whichleads to:

$$B_z = -\frac{\mu_0}{4\pi^2}\int\int_{-\infty}^{+\infty} d\alpha d\beta \sin(\alpha x)\cos(\beta z)e^{\sqrt{\alpha^2+\beta^2}}\cosh(y\sqrt{\alpha^2+\beta^2})\hat{J}_x^a(\alpha,\beta)\left[1-e^{-2\sqrt{\alpha^2+\beta^2}(b-a)}\right] \quad (49)$$

and $$J_x^a(\alpha,\beta) = i\hat{J}_x^a(\alpha,\beta) \Rightarrow \hat{J}_x^a(\alpha,\beta) = 4\int\int_0^{\infty} dxdz \sin(\alpha x)\cos(\beta z)J_x^a(x,z) \quad (50)$$

Employing the current density's symmetry conditions, the shielding condition and the continuity $$W_M = \frac{1}{2}\int_V d^3\vec{x}\,\vec{A}\cdot\vec{J} \quad (51)$$

$$= \frac{\mu_0}{8\pi^2}\int\int_{-\infty}^{+\infty} d\alpha d\beta \frac{\sqrt{\alpha^2+\beta^2}}{\beta^2}|J_x^a(\alpha,\beta)|^2\left(1-e^{-2a\sqrt{\alpha^2+\beta^2}}\right)$$

$$\left[1-e^{-2\sqrt{\alpha^2+\beta^2}(b-a)}\right]$$

equation, the expression for the stored magnetic energy is given by:

In order to find the optimum continuous current density, which will generate a gradient magnetic field in predetermined locations inside the imaging volume, can be extracted via a Lagrange optimization technique, According to this technique, a functional expression, which is a quadratic function of the current density is constructed. An example of such an expression includes which includes the stored magnetic energy and the magnetic field, and can have the form:

$$F(J_x^a) = W_m - \sum_{j=1}^{N} \lambda_j [B_z(\vec{r}_j) - B_{zsc}(\vec{r}_j)] \quad (42)$$

where $\lambda_j$ are the Lagrange multipliers and $B_{zsc}(r_j)$ are the constrained values of the magnetic field inside the desired imaging volume. Minimizing F with respect to $J_x^a$, a linear matrix equation for $J_x^a$ is obtained:

$$J_x^a = \frac{\beta^2}{\sqrt{\alpha^2+\beta^2}} \frac{e^{-a\sqrt{\alpha^2+\beta^2}}}{\left(1 - e^{-2a\sqrt{\alpha^2+\beta^2}}\right)} \sum_{j=1}^{N} \lambda_j \sin(\alpha x_j)\cos(\beta z_j) \cosh\left(y_j \sqrt{\alpha^2+\beta^2}\right) \quad (52)$$

and the Lagrange multipliers are determined via the constrained equation:

$$C_{ij} = \quad (53)$$

$$\frac{\mu_0}{\pi^2} \int\int_{-\infty}^{+\infty} d\alpha d\beta \sin(\alpha x_i)\cos(\beta z_i)\cosh\left(y_i\sqrt{\alpha^2+\beta^2}\right) \frac{\beta^2}{\sqrt{\alpha^2+\beta^2}}$$

$$\frac{e^{-a\sqrt{\alpha^2+\beta^2}}\left[1 - e^{-2(b-a)\sqrt{\alpha^2+\beta^2}}\right]}{\left(1 - e^{-2a\sqrt{\alpha^1+\beta^1}}\right)}$$

$$\sum_{j=1}^{N} \lambda_j \sin(\alpha x_j)\cos(\beta z_j)\cosh\left(y_j\sqrt{\alpha^2+\beta^2}\right)$$

For the case of a non-shielded biplanar transverse gradient set, the above expressions are the same at the limit when $b \to \infty$.

From the continuous current distribution and using employing the stream function technique, a discrete set of loops that closely approximates the continuous current density pattern is generated. In order to verify the accuracy of the discretization, the gradient field of the coil is re-evaluated by applying the Biot-Savart law to the discrete current distribution.

Transverse Z Gradient Coil

For the Z gradient coil, the gradient magnetic field is symmetric along the y and x directions while it is asymmetric along the z direction. In this case the relationship between the current densities on the adjacent planes is:

$$J_x^a(\alpha,\beta) = -J_x^{-a}(\alpha,\beta) \text{ and } J_x^b(\alpha,\beta) = -J_x^{-b}(\alpha,\beta) \quad (54)$$

The expression of the magnetic field from equations (34) and (35) becomes:

$$B_z = -\frac{\mu_0}{8\pi^2} \int\int_{-\infty}^{+\infty} d\alpha d\beta e^{i\alpha x + i\beta z} \begin{bmatrix} J_x^a(\alpha,\beta)\left(e^{\sqrt{\alpha^2+\beta^2}(a-y)} + e^{\sqrt{\alpha^2+\beta^2}(a+y)}\right) + \\ J_x^b(\alpha,\beta)\left(e^{\sqrt{\alpha^2+\beta^2}(b-y)} + e^{\sqrt{\alpha^2+\beta^2}(b+y)}\right) \end{bmatrix} \text{ for } |y| \leq a \quad (55)$$

$$B_z = -\partial_z A_y = -\frac{\mu_0}{8\pi^2} \int\int_{-\infty}^{+\infty} d\alpha d\beta e^{i\alpha x + i\beta z} \begin{bmatrix} J_x^a(\alpha,\beta)\left(-e^{\sqrt{\alpha^2+\beta^2}\,a} 2\cosh\left(y\sqrt{\alpha^2+\beta^2}\right)\right) - \\ J_x^b(\alpha,\beta)\left(-e^{b\sqrt{\alpha^2+\beta^2}\,a} 2\cosh\left(y\sqrt{\alpha^2+\beta^2}\right)\right) \end{bmatrix} \text{ for } |y| \geq b \quad (56)$$

The gradient field shielding condition in the region outside both planes demands that $B_z = 0$ for $|y| \geq b$. Equation (56) leads to:

$$J_x^{-b'}(\alpha,\beta) = -e^{\sqrt{\alpha^2+\beta^2}(b'-a')} J_x^{-a'}(\alpha,\beta) \quad (57)$$

whichleads to:

$$B_z = \frac{\mu_0}{4\pi^2} \int\int_{-\infty}^{+\infty} d\alpha d\beta \cos(\alpha x)\sin(\beta z) e^{\sqrt{\alpha^2+\beta^2}} \cosh\left(y\sqrt{\alpha^2+\beta^2}\right) \hat{J}_x^a(\alpha,\beta)\left[1 - e^{-2\sqrt{\alpha^2+\beta^2}(b-a)}\right] \quad (58)$$

and $$J_x^a(\alpha,\beta) = i\hat{J}_x^a(\alpha,\beta) \Rightarrow \hat{J}_x^a(\alpha,\beta) = -4i \int\int_0^{\infty} dx dz \cos(\alpha x)\sin(\beta z) J_x^a(x,z) \quad (59)$$

Employing the current density's symmetry conditions, the shielding condition and the continuity $$W_M = \frac{1}{2} \int_V d^3\vec{x}\, \vec{A} \cdot \vec{J} \tag{51}$$

$$= \frac{\mu_0}{8\pi^2} \int\int_{-\infty}^{+\infty} d\alpha d\beta \frac{\sqrt{\alpha^2+\beta^2}}{\beta^2} |J_x^a(\alpha,\beta)|^2 \left(1 - e^{-2a\sqrt{\alpha^2+\beta^2}}\right)$$

$$\left[1 - e^{-2\sqrt{\alpha^2+\beta^2}\,(b-a)}\right]$$

equation, the expression for the stored magnetic energy is given by:
In order to find the optimum continuous current density, which will generate a gradient magnetic field in predetermined locations inside the imaging volume, can be extracted via a Lagrange $$F(J_x^a) = W_m - \sum_{j=1}^{N} \lambda_j [B_z(\vec{r}_j) - B_{zsc}(\vec{r}_j)] \tag{42}$$

optimization technique, According to this technique, a functional expression, which is a quadratic function of the current density is constructed. An example of such an expression includes which includes the stored magnetic energy and the magnetic field, and can have the form:
where $\lambda_j$ are the Lagrange multipliers and $B_{zsc}(r_j)$ are the constrained values of the magnetic field inside the desired imaging volume. Minimizing F with respect to $J_x^a$, a linear matrix equation for $J_x^a$ is obtained:

$$J_x^a = \frac{\beta^2}{\sqrt{\alpha^2+\beta^2}} \frac{e^{-a\sqrt{\alpha^2+\beta^2}}}{\left(1 - e^{-2a\sqrt{\alpha^2+\beta^2}}\right)} \sum_{j=1}^{N} \lambda_j \cos(\alpha x_j)\sin(\beta z_j)\cosh\!\left(y_j\sqrt{\alpha^2+\beta^2}\right)$$

and the Lagrange multipliers are determined via the constrained equation:

$$C_{ij} = \tag{61}$$

$$\frac{\mu_0}{\pi^2}\int\int_{-\infty}^{+\infty} d\alpha d\beta \cos(\alpha x_i)\sin(\beta z_i)\cosh\!\left(y_i\sqrt{\alpha^2+\beta^2}\right)\frac{\beta^2}{\sqrt{\alpha^2+\beta^2}}$$

$$\frac{e^{-a\sqrt{\alpha^2+\beta^2}}\left[1 - e^{-2(b-a)\sqrt{\alpha^2+\beta^2}}\right]}{\left(1 - e^{-2a\sqrt{\alpha^1+\beta^1}}\right)}$$

$$\sum_{j=1}^{N} \lambda_j \cos(\alpha x_j)\sin(\beta z_j)\cosh\!\left(y_j\sqrt{\alpha^2+\beta^2}\right)$$

For the case of a non-shielded biplanar transverse gradient set, the above expressions are the same at the limit when $b\to\infty$.

From the continuous current distribution and using employing the stream function technique, a discrete set of loops that closely approximates the continuous current density pattern is generated. In order to verify the accuracy of the discretization, the gradient field of the coil is re-evaluated by applying the Biot-Savart law to the discrete current distribution.

Mutual Inductance Evaluations for Biplanar Open Architecture Coils

Let us assume a second biplanar gradient set with plane gaps for the primary and secondary coils at locations of $z=2\bar{a}$ and $z=2\bar{b}$, respectively. If the second set is shifted along the x or z directions or both by an amount of $x_0$ and $z_0$, respectively, the analytical expression of the current density distribution is given by:

$$\tag{60}$$

$$J_x^{-\bar{a},-\bar{b}}(\alpha,\beta) = e^{i\beta z_0} e^{-i\alpha x_0} \int\int_{-\infty}^{+\infty} dx dz\, e^{-i\beta(z-z_0)} e^{-i\alpha(x-x_0)} J_x^{-\bar{a},-\bar{b}}(x,z) \tag{62}$$

Considering for simplicity of the evaluations, that the second set is shifted only along the z direction by an amount of $z_0$. In this situation the mutual energy between these two modules is given by:

$$W_{mutual} = \frac{1}{2}\int_V d^3\vec{x}\, \vec{A}^{(\bar{a},\bar{b})} \cdot \vec{J}^{(\bar{a}',\bar{b})} \tag{63}$$

$$= \frac{\mu_0}{4\pi^2}\int\int_{-\infty}^{+\infty} d\alpha d\beta \frac{\sqrt{\alpha^2+\beta^2}}{\beta^2} e^{-i\beta z_0}$$

$$\left\{\begin{array}{l} \left[\left(e^{-\sqrt{\alpha^2+\beta^2}\,(a-\bar{a})} - e^{-2\sqrt{\alpha^2+\beta^2}\,(b-(a+\bar{a}))}\right)(J_x^a(\alpha,\beta)J_x^{\bar{a}^*}(\alpha,\beta) + J_x^{-a}(\alpha,\beta)J_x^{\bar{a}^*}(\alpha,\beta)] + \\ \left[\left(e^{-\sqrt{\alpha^2+\beta^2}\,(a+\bar{a})} - e^{-2\sqrt{\alpha^2+\beta^2}\,(b-(a-\bar{a}))}\right)(J_x^{-a}(\alpha,\beta)J_x^{\bar{a}^*}(\alpha,\beta) + J_x^a(\alpha,\beta)J_x^{\bar{a}^*}(\alpha,\beta)] \end{array}\right\}$$

Transverse Y Gradient Coil

Considering the current density symmetries amongst the planes of the self-shielded biplanar gradient coil design, as well as that the mutual energy is evaluated over two gradient coil representing the same axis, equation (63) has the form:

$$W_{Mutual} = \frac{\mu_0}{4\pi^2} \int\int_{-\infty}^{+\infty} d\alpha d\beta \frac{\sqrt{\alpha^2+\beta^2}}{\beta^2} \cos(\beta z_0) J_x^a(\alpha,\beta) \quad (64)$$

$$J_x^{a^*}(\alpha,\beta)\left[e^{\sqrt{\alpha^2+\beta^2}\,(a-\overline{a})}\left[1-e^{-2\sqrt{\alpha^2+\beta^2}\,(b-(a-\overline{a}))}\right]+\right.$$

$$\left. e^{-\sqrt{\alpha^2+\beta^2}\,(a-\overline{a})}\left[1-e^{-2\sqrt{\alpha^2+\beta^2}\,(b-(a+\overline{a}))}\right]\right]$$

The optimum phased array configuration occurs at the $z_0$ points where the value of the mutual inductance between the two sets is minimized.

X and Z Gradient Coils

Considering the current density symmetries amongst the planes of the self-shielded biplanar gradient coil design, as well as that the mutual energy is evaluated over two gradient coil representing the same axis, equation (63) has the form:

$$W_{Mutual} = \frac{\mu_0}{4\pi^2} \int\int_{-\infty}^{+\infty} d\alpha d\beta \frac{\sqrt{\alpha^2+\beta^2}}{\beta^2} \cos(\beta z_0) J_x^a(\alpha,\beta) \quad (65)$$

$$J_x^{a^*}(\alpha,\beta)\left[e^{\sqrt{\alpha^2+\beta^2}\,(a-\overline{a})}\left[1+e^{-2\sqrt{\alpha^2+\beta^2}\,(b-(a-\overline{a}))}\right]-\right.$$

$$\left. e^{-\sqrt{\alpha^2+\beta^2}\,(a+\overline{a})}\left[1-e^{-2\sqrt{\alpha^2+\beta^2}\,(b-(a+\overline{a}))}\right]\right]$$

The optimum phased array configuration occurs at the $z_0$ points where the value of the mutual inductance between the two sets is minimized.

Design and Results

1) Non-Shielded Biplanar Gradient Coils i) Transverse Y Biplanar Gradient Coil:

For the non-shielded transverse biplanar gradient coils, where the gap between the two planes is chosen to be 2a=288 mm, the constraint points for the minimization algorithm are shown in Table 1. The gradient field at the center of the structure is demanded to be 40 mT/m with 10% on axis linearity at a distance of ±130 mm from the center of the gradient and 20% of f axis uniformity inside a 25 cm Diameter Spherical Volume (DSV).

TABLE 1

Constraints for a Non-Shielded Biplanar Y gradient coil

| Xj in meters | Yj in meters | Zj in meters | Bzscj in Tesla |
|---|---|---|---|
| 0.000 | 0.001 | 0.000 | 0.0000400 |
| 0.000 | 0.130 | 0.000 | 0.0046800 |
| 0.125 | 0.001 | 0.000 | 0.0000320 |
| 0.000 | 0.001 | 0.125 | 0.0000320 |

The application of the Lagrange minimization technique to the set of constraints of the Table 1, generates a continuous current distribution for primary coil of the Transverse Non-Shielded Y biplanar coil. With the assist of the stream function technique, the continuous current densities for the two coils can be approximated by a 10 discrete loops with a common current of 287.6 Amps). Table 2 illustrates all the vital characteristics needed for the engineering and manufacturing phase of such a gradient coil.

TABLE 2

Non-Shielded Y Biplanar Gradient Coil

| Property | |
|---|---|
| Gap | 288 mm |
| Gradient Strength at mT/m/100 A | 13.9 mT/m/100 A |
| Gradient Strength at 500 A | 69.5 mT/m |
| 450 A | 62.55 mT/m |
| 330 A | 45.87 mT/m |
| Number of Discrete Loops | 10 |
| Cu thick. between adjacent loops | >12.5 mm |
| Total Inductance (cable included) | 95 μH |
| Total Resistance (Cable included) | 55 mΩ |
| Rise Time at 2000 V/500 A | 24 μsec |
| 700 V/450 A | 70 μsec |
| | 82 μsec |
| Slew Rate at 2000 V/500 A | 2865 T/m/sec |
| 700 V/450 A | 880 T/m/sec |
| 400 V/330 A | 550 T/m/sec |
| Duty Cycle (RMS Gradient) | |
| (500 A ref. point) at 4500 kW | 72% of the peak gradient(49.68 mT/m) |
| at 2000 kW | 49% of the peak gradient(33.81 mT/m) |
| at 1000 kW | 34% of the peak gradient(23.46 mT/m) | ii) Transverse X Biplanar Gradient Coil:

For the non-shielded transverse biplanar gradient coils, where the gap between the two planes is chosen to be 2a=284 mm, the constraint points for the minimization algorithm are shown in Table 3. The gradient field at the center of the structure is demanded to be 40 mT/m with 10% on axis linearity at a distance of ±130 mm from the center of the gradient and 20% of f axis uniformity inside a 25 cm Diameter Spherical Volume (DSV).

TABLE 3

Constraints for a Non-Shielded Biplanar X gradient coil

| Xj in meters | Yj in meters | Zj in meters | Bzscj in Tesla |
|---|---|---|---|
| 0.001 | 0.000 | 0.000 | 0.0000400 |
| 0.130 | 0.000 | 0.000 | 0.0046800 |
| 0.001 | 0.125 | 0.000 | 0.0000320 |
| 0.001 | 0.000 | 0.125 | 0.0000320 |

The application of the Lagrange minimization technique to the set of constraints of the Table 3, generates a continuous current distribution for primary coil of the Transverse Non-Shielded X biplanar coil. With the assist of the stream function technique, the continuous current densities for the two coils can be approximated by a 10 discrete loops with a common current of 282.9 Amps). Table 4 illustrates all the vital characteristics needed for the engineering and manufacturing phase of such a gradient coil.

TABLE 4

Non-Shielded X Biplanar Gradient Coil

| Property | |
|---|---|
| Gap | 284 mm |
| Gradient Strength at mT/m/100 A | 15.62 mT/m/100 A |
| Gradient Strength at 500 A | 78.1 mT/m |
| 450 A | 70.2 mT/m |
| 330 A | 51.5 mT/m |
| Number of Discrete Loops | 10 |
| Cu thick. between adjacent loops | >12.5 mm |

TABLE 4-continued

Non-Shielded X Biplanar Gradient Coil

| | |
|---|---|
| Total Inductance (cable included) | 177 $\mu$H |
| Total Resistance (Cable included) | 59 m$\Omega$ |
| Rise Time at 2000 V/500 A | 45 $\mu$sec |
| 700 V/450 A | 118 $\mu$sec |
| | 154 $\mu$sec |
| Linear Slew Rate at 2000 V/500 A | 1738 T/m/sec |
| 700 V/450 A | 593 T/m/sec |
| 400 V/330 A | 335 T/m/sec |
| Duty Cycle (RMS Gradient) | |
| (500 A ref. point) at 4500 kW | 68% of the peak gradient(53.11 mT/m) |
| at 2000 kW | 45% of the peak gradient(35.37 mT/m) |
| at 1000 kW | 32% of the peak gradient(25.0 mT/m) | iii) Axial Z Biplanar Gradient Coil:

For the non-shielded Axial biplanar gradient coils, where the gap between the two planes is chosen to be 2a=292 mm, the constraint points for the minimization algorithm are shown in Table 5. The gradient field at the center of the structure is demanded to be 40 mT/m with 10% on axis linearity at a distance of ±130 mm from the center of the gradient and 20% of f axis uniformity inside a 25 cm Diameter Spherical Volume (DSV).

TABLE 5

Constraints for a Non-Shielded Biplanar Z gradient coil

| Xj in meters | Yj in meters | Zj in meters | Bzscj in Tesla |
|---|---|---|---|
| 0.000 | 0.000 | 0.001 | 0.0000400 |
| 0.000 | 0.000 | 0.130 | 0.0046800 |
| 0.125 | 0.000 | 0.001 | 0.0000325 |
| 0.000 | 0.125 | 0.001 | 0.0000325 |

The application of the Lagrange minimization technique to the set of constraints of the Table 5, generates a continuous current distribution for primary coil of the Axial Non-Shielded Z biplanar coil. With the assist of the stream function technique, the continuous current densities for the two coils can be approximated by a 10 discrete loops with a common current of 298.15 Amps. Table 6 illustrates all the vital characteristics needed for the engineering and manufacturing phase of such a gradient coil.

TABLE 6

Non-Shielded Z Biplanar Gradient Coil

| Property | |
|---|---|
| Gap | 292 mm |
| Gradient Strength at mT/m/100 A | 13.41 mT/m/100 A |
| Gradient Strength at 500 A | 67.08 mT/m |
| 450 A | 60.37 mT/m |
| 330 A | 44.27 mT/m |
| Number of Discrete Loops | 10 |
| Cu thick. between adjacent loops | >12.5 mm |
| Total Inductance (cable included) | 73 $\mu$H |
| Total Resistance (Cable included) | 61 m$\Omega$ |
| Rise Time at 2000 V/500 A | 19 $\mu$sec |
| 700 V/450 A | 49 $\mu$sec |
| 400 V/330 A | 64 $\mu$sec |
| Linear Slew Rate at 2000 V/500 A | 3530 T/m/sec |
| 700 V/450 A | 1235 T/m/sec |
| 400 V/330 A | 698 T/m/sec |

TABLE 6-continued

Non-Shielded Z Biplanar Gradient Coil

| | |
|---|---|
| Duty Cycle (RMS Gradient) | |
| (500 A ref. point) at 4500 kW | 61% of the peak gradient(40.66 mT/m) |
| at 2000 kW | 40% of the peak gradient(27.1 mT/m) |
| at 1000 kW | 29% of the peak gradient(19.2 mT/m) |

2) Shielded Biplanar Gradient Coils i) Transverse Y Biplanar Gradient Coil:

For the shielded transverse biplanar gradient coils, the gap between the two primary coil's planes is chosen to be 2a=288 mm, while the gap between the shielding planes is 2b=337 mm. The constraint points for the minimization algorithm are shown in Table 7. The gradient field at the center of the structure is demanded to be 40 mT/m with 10% on axis linearity at a distance of ±130 mm from the center of the gradient and 20% of f axis uniformity inside a 25 cm Diameter Spherical Volume (DSV).

TABLE 7

Constraints for a Shielded Biplanar Y gradient coil

| Xj in meters | Yj in meters | Zj in meters | Bzscj in Tesla |
|---|---|---|---|
| 0.000 | 0.001 | 0.000 | 0.0000400 |
| 0.000 | 0.130 | 0.000 | 0.0046800 |
| 0.125 | 0.001 | 0.000 | 0.0000320 |
| 0.000 | 0.001 | 0.125 | 0.0000320 |

Figure 2:
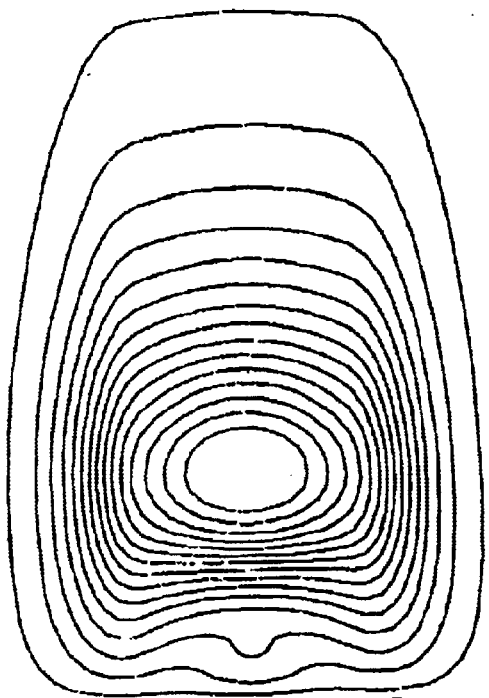
FIG. 2 is a gradient pattern.
Figure 3:
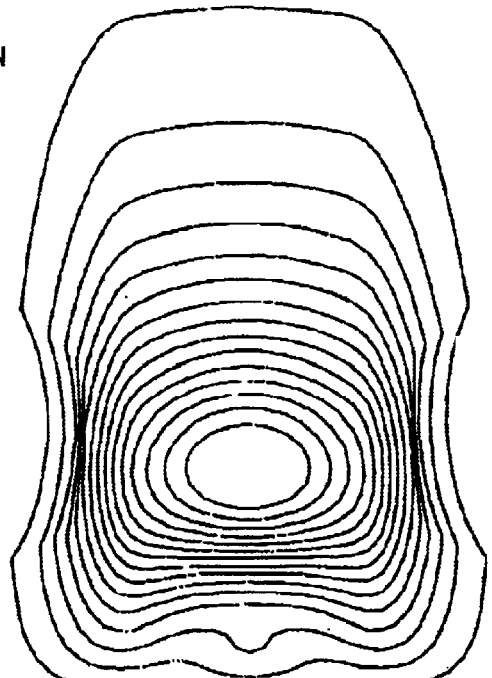
FIG. 3 is a gradient pattern.
Figure 4A:
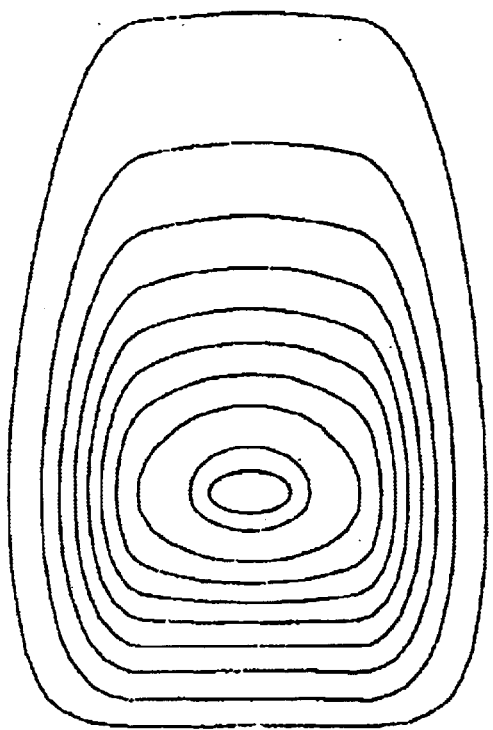
FIG. 4a is a gradient pattern.
Figure 4B:
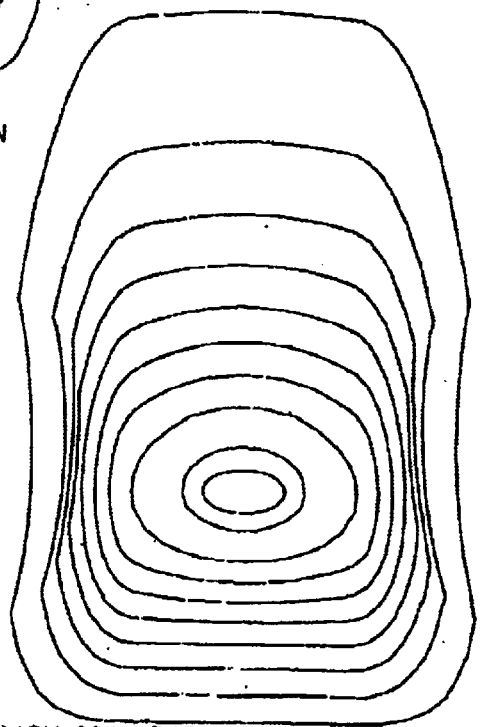
FIG. 4b is a gradient pattern.

The application of the Lagrange minimization technique to the set of constraints of the Table 7, generates a continuous current distribution for primary coil of the Transverse Shielded Y biplanar coil. With the assist of the stream function technique, the continuous current densities for the primary coil can be approximated by a 15 discrete loops with a common current of 425.85 Amps (FIG. 2). For a shielded Y biplanar gradient coil with parabolic returns, the current pattern for the primary coil is shown in FIG. 3. while for the secondary coil its continuous current density can be approximated by 10 loops (FIG. 4a) with the same constant current as the primary coils. For a shielded Y biplanar gradient coil with parabolic returns, the current pattern for the secondary coil is shown in FIG. 4b. Table 8 illustrates all the vital characteristics needed for the engineering and manufacturing phase of such a gradient coil.

TABLE 8

Shielded Y Biplanar Gradient Coil

| Property | |
|---|---|
| Gap primary/shielding | 288 mm/337 mm |
| Gradient Strength at mT/m/100 A | 9.39 mT/m/100 A |
| Gradient Strength at 500 A | 46.95 mT/m |
| 450 A | 42.26 mT/m |
| 330 A | 31.00 mT/m |
| Number of Discrete Loops | 15/10 |
| Cu thick. between adjacent loops | 11.4 mm/15.8 mm |
| Total Inductance (cable included) | 105 $\mu$H |
| Total Resistance (Cable included) | 95 m$\Omega$ |
| Rise Time at 2000 V/500 A | 27 $\mu$sec |
| 700 V/450 A | 72 $\mu$sec |
| 400 V/330 A | 94 $\mu$sec |

TABLE 8-continued

Shielded Y Biplanar Gradient Coil

| | |
|---|---|
| Slew Rate at 2000 V/500 A | 1746 T/m/sec |
| 700 V/450 A | 587 T/m/sec |
| 400 V/330 A | 330 T/m/sec |
| Duty Cycle (RMS Gradient) | |
| (500 A ref. point) at 4500 kW | 47% of the peak gradient(22.27 mT/m) |
| at 2000 kW | 32% of the peak gradient(14.85 mT/m) |
| at 1000 kW | 22% of the peak gradient(10.50 mT/m) |
| % Eddy Currents at 25 cm DSV | 0.32% | iv) Transverse X Biplanar Gradient Coil:

For the shielded transverse biplanar gradient coils, where the gap between the two primary planes is chosen to be 2a=284 mm, while the gap between the shielding planes is 2b=341 mm. The constraint points for the minimization algorithm are shown in Table 9. The gradient field at the center of the structure is demanded to be 40 mT/m with 10% on axis linearity at a distance of ±130 mm from the center of the gradient and 20% of f axis uniformity inside a 25 cm Diameter Spherical Volume (DSV).

TABLE 9

Constraints for a Shielded Biplanar X gradient coil

| Xj in meters | Yj in meters | Zj in meters | Bzscj in Tesla |
|---|---|---|---|
| 0.001 | 0.000 | 0.000 | 0.0000400 |
| 0.130 | 0.000 | 0.000 | 0.0046800 |
| 0.001 | 0.125 | 0.000 | 0.0000320 |
| 0.001 | 0.000 | 0.125 | 0.0000320 |

Figure 5:
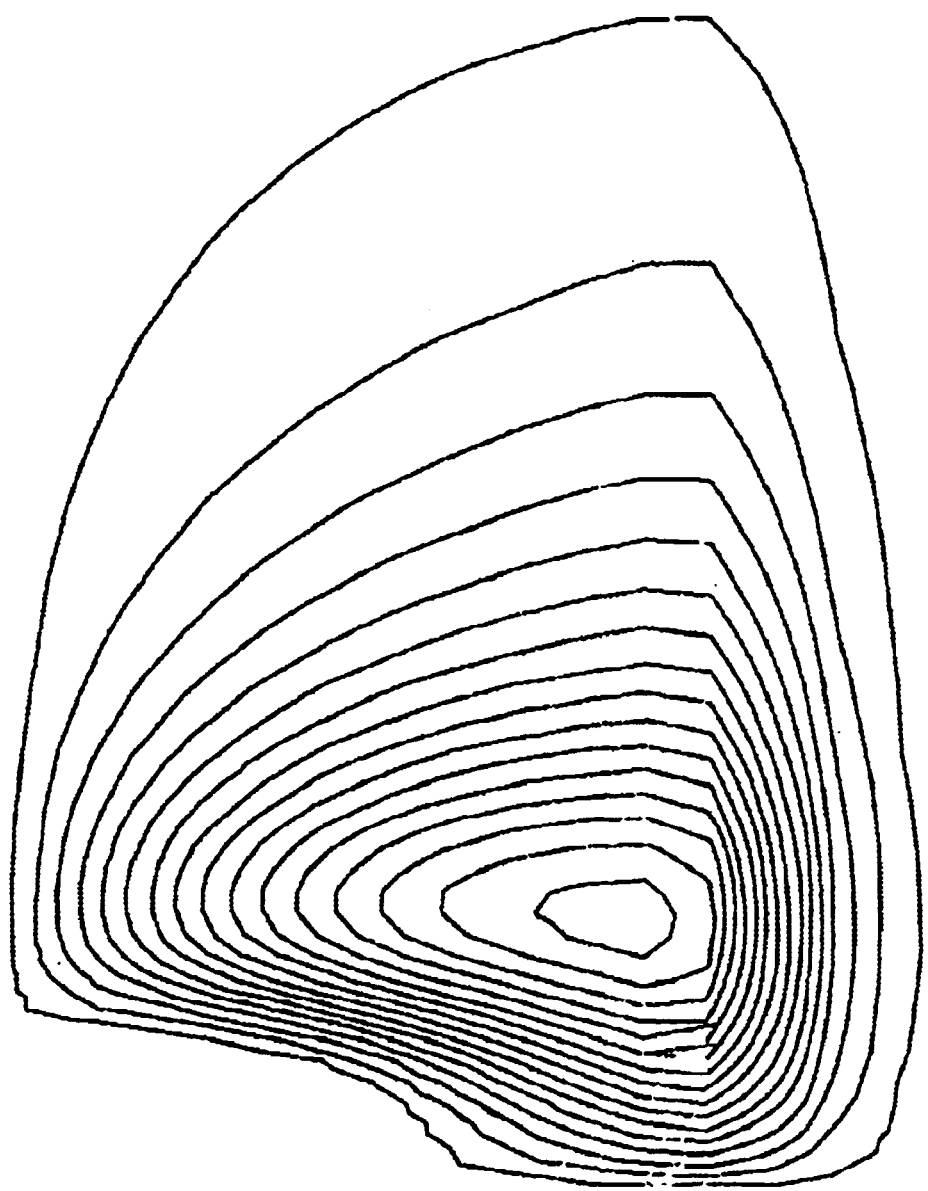
FIG. 5 is a gradient pattern.
Figure 6:
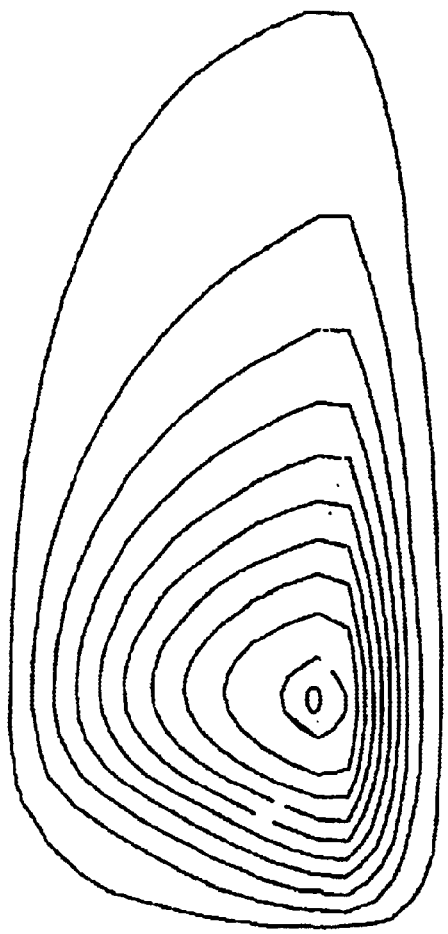
FIG. 6 is a gradient pattern.

The application of the Lagrange minimization technique to the set of constraints of the Table, generates a continuous current distribution for primary coil of the Transverse Shielded X biplanar coil. With the assist of the stream function technique, the continuous current density for the primary coil can be approximated by a 16 discrete loops with a common current of 339.2 Amps (FIG. 5). The continuous current density of the shielding coil can be also approximated by a set of 11 discrete loops carrying the same current as the primary coil (FIG. 6). Table 10 illustrates all the vital characteristics needed for the engineering and manufacturing phase of such a gradient coil.

TABLE 10

Shielded X Biplanar Gradient Coil

| Property | |
|---|---|
| Gap primary/shielding | 284 mm/341 mm |
| Gradient Strength at mT/m/100 A | 11.79 mT/m/100 A |
| Gradient Strength at 500 A | 59.00 mT/m |
| 450 A | 53.10 mT/m |
| 330 A | 38.93 mT/m |
| Number of Discrete Loops | 16/11 |
| Cu thick. between adjacent loops | 10.8 mm/15.8 mm |
| Total Inductance (cable included) | 203 μH |
| Total Resistance (Cable included) | 103 mΩ |
| Rise Time at 2000 V/500 A | 53 μsec |
| 700 V/450 A | 140 μsec |
| 400 V/330 A | 183 μsec |
| Slew Rate at 2000 V/500 A | 1132 T/m/sec |
| 700 V/450 A | 422 T/m/sec |
| 400 V/330 A | 213 T/m/sec |

TABLE 10-continued

Shielded X Biplanar Gradient Coil

| | |
|---|---|
| Duty Cycle (RMS Gradient) | |
| (500 A ref. point) at 4500 kW | 45% of the peak gradient(26.55 mT/m) |
| at 2000 kW | 30% of the peak gradient(17.59 mT/m) |
| at 1000 kW | 21% of the peak gradient(12.44 mT/m) |
| % Eddy Currents at 25 cm DSV | 0.37% | v) Axial Z Biplanar Gradient Coil:

For the shielded Axial biplanar gradient coils, where the gap between the two primary planes is chosen to be 2a=292 mm. The distance between the two shielding planes is 2b=345 mm. The constraint points for the minimization algorithm are shown in Table 11. The gradient field at the center of the structure is demanded to be 40 mT/m with 10% on axis linearity at a distance of ±130 mm from the center of the gradient and 7.5% of f axis uniformity inside a 25 cm Diameter Spherical Volume (DSV).

TABLE 11

Constraints for a Shielded Biplanar Z gradient coil

| Xj in meters | Yj in meters | Zj in meters | Bzscj in Tesla |
|---|---|---|---|
| 0.000 | 0.000 | 0.001 | 0.0000400 |
| 0.000 | 0.000 | 0.130 | 0.0046800 |
| 0.125 | 0.000 | 0.001 | 0.0000394 |
| 0.000 | 0.125 | 0.001 | 0.0000394 |

Figure 7:
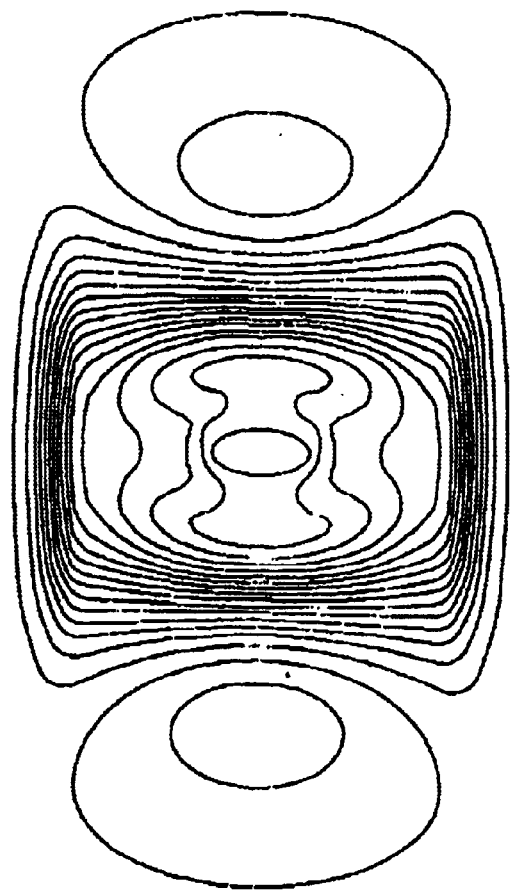
FIG. 7 is a gradient pattern.
Figure 8:
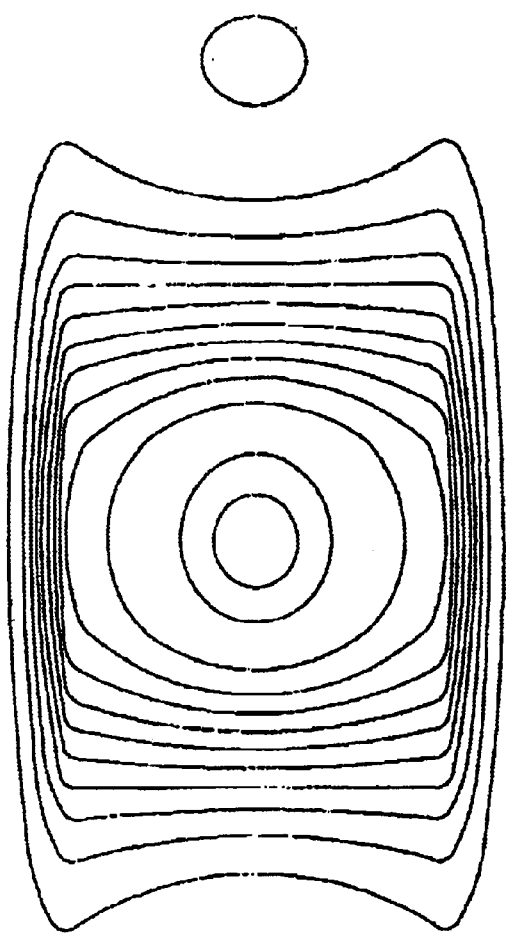
FIG. 8 is a gradient pattern.

The application of the Lagrange minimization technique to the set of constraints of the Table 11, generates a continuous current distribution for primary coil of the Axial Shielded Z biplanar coil. With the assist of the stream function technique, the continuous current densities for the primary coil can be approximated by 16 discrete loops with a common current of 420.9 Amps (FIG. 7). the continuous current density for the shielding coil can be approximated by 12 discrete loops (FIG. 8) Table 12 illustrates all the vital characteristics needed for the engineering and manufacturing phase of such a gradient coil.

TABLE 12

Shielded Z Biplanar Gradient Coil

| Property | |
|---|---|
| Gap primary/shielding | 292 mm/345 mm |
| Gradient Strength at mT/m/100 A | 9.50 mT/m/100 A |
| Gradient Strength at 500 A | 47.51 mT/m |
| 450 A | 42.76 mT/m |
| 330 A | 31.36 mT/m |
| Number of Discrete Positive Loops | 16/12 |
| Cu thick. between adjacent loops | 11.0 mm/15.8 mm |
| Total Inductance (cable included) | 108 μH |
| Total Resistance (Cable included) | 107 mΩ |
| Rise Time at 2000 V/500 A | 28 μsec |
| 700 V/450 A | 75 μsec |
| 400 V/330 A | 98 μsec |
| Slew Rate at 2000 V/500 A | 1712 T/m/sec |
| 700 V/450 A | 573 T/m/sec |
| 400 V/330 A | 320 T/m/sec |
| Duty Cycle (RMS Gradient) | |
| (500 A ref. point) at 4500 kW | 44% of the peak gradient(20.68 mT/m) |

TABLE 12-continued

| Shielded Z Biplanar Gradient Coil | |
| --- | --- |
| at 2000 kW | 29% of the peak gradient(13.79 mT/m) |
| at 1000 kW | 21% of the peak gradient(9.75 mT/m) |
| % Eddy Currents at 25 cm DSV | 0.33% |

3) Non-Shielded Uniplanar Gradient Coils i) Transverse X, Y Uniplanar Gradient Coil For the non-shielded transverse uniplanar gradient coils, where the gap between the plane from the geometric center of the structure of the gradient coil is chosen to be −a'=−6 mm, the constraint points for the minimization algorithm are shown in Table 13. The gradient field at the center of the structure is demanded to be 40 mT/m with 10% on axis linearity at a distance of ±100 mm from the center of the gradient and 20% of f axis uniformity inside a 25 cm Diameter Spherical Volume (DSV).

TABLE 13

Constraints for a Non-Shielded Uniplanar transverse(X,Y) gradient coils

| Xj in meters | Yj in meters | Zj in meters | Bzscj in Tesla |
| --- | --- | --- | --- |
| 0.000 | 0.001 | 0.100 | 0.0000400 |
| 0.000 | 0.060 | 0.100 | 0.0024000 |
| 0.000 | 0.200 | 0.100 | 0.0072800 |
| 0.180 | 0.001 | 0.100 | 0.0000360 |
| 0.000 | 0.001 | 0.150 | 0.0000410 |
| 0.000 | 0.001 | 0.200 | 0.0000350 |

Figure 9:
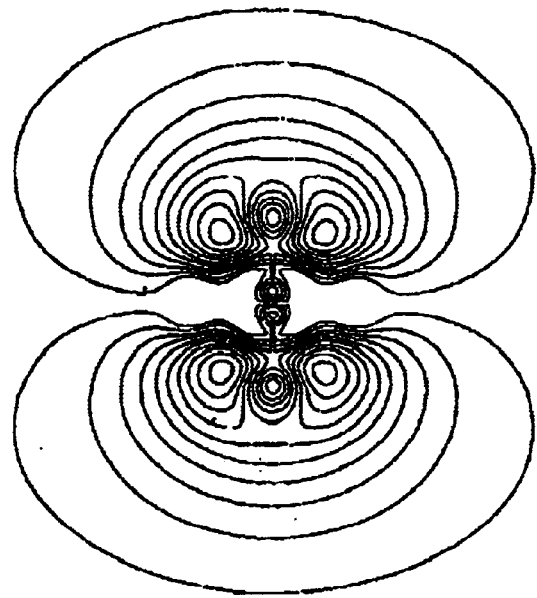
FIG. 9 is a gradient pattern.

The application of the Lagrange minimization technique to the set of constraints of the Table 13, generates a continuous current distribution for primary coil of the Transverse Non-Shielded Y uniplanar coil. With the assist of the stream function technique, the continuous current densities for the coil can be approximated by a 10 discrete loops with a common current of 411.2 Amps (FIG. 9). Table 14 illustrates all the vital characteristics needed for the engineering and manufacturing phase of such a gradient coil.

TABLE 14

| Non-Shielded Transverse(X,Y) Uniplanar Gradient Coil | |
| --- | --- |
| Property | |
| Gradient Strength at mT/m/100 A | 9.73 mT/m/100 A |
| Gradient Strength at 500 A | 48.64 mT/m |
| 450 A | 43.77 mT/m |
| 330 A | 32.11 mT/m |
| Number of Discrete Loops | 10 |
| Cu thick. between adjacent loops | >10.2 mm |
| Total Inductance (cable included) | 295 μH |
| Total Resistance (Cable included) | 73 mΩ |
| Rise Time at 2000 V/500 A | 75 μsec |
| 700 V/450 A | 199 μsec |
| 400 V/330 A | 259 μsec |
| Slew Rate at 2000 V/500 A | 648 T/m/sec |
| 700 V/450 A | 220 T/m/sec |
| 400 V/330 A | 124 T/m/sec |
| Duty Cycle (RMS Gradient) | |
| (500 A ref. point) at 4500 kW | 53.4% of the peak gradient(26 mT/m) |
| at 2000 kW | 36% of the peak gradient(17.33 mT/m) |
| at 1000 kW | 25% of the peak gradient(12.26 mT/m) | ii) Axial Z Uniplanar Gradient Coil:

For the non-shielded Axial Uniplanar gradient coil, the gap between the geometric center of the structure of the gradient coil and the planar surface is chosen to be −a'=−6 mm. The constraint points for the minimization algorithm are shown in Table 15. The gradient field at the center of the structure is demanded to be 40 mT/m with 20% on axis linearity at a distance of +200 mm from the center of the gradient with no-rollover point and 20% of f axis uniformity inside a 20 cm Diameter Spherical Volume (DSV).

TABLE 15

Constraints for a Non-Shielded Uniplanar Z gradient coil

| Xj in meters | Yj in meters | Zj in meters | Bzscj in Tesla |
| --- | --- | --- | --- |
| 0.000 | 0.000 | 0.031 | 0.0000400 |
| 0.000 | 0.000 | 0.231 | 0.0062800 |
| 0.180 | 0.000 | 0.031 | 0.00003600 |
| 0.000 | 0.200 | 0.031 | 0.00003200 |

Figure 10:
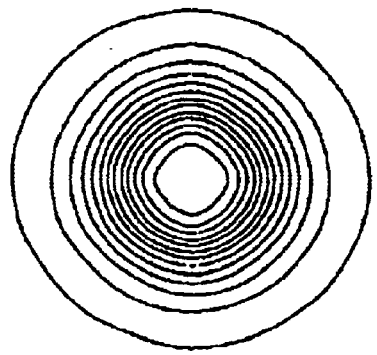
FIG. 10 is a gradient pattern.

The application of the Lagrange minimization technique to the set of constraints of the Table 15 generates a continuous current distribution for primary coil of the Axial Non-Shielded Z uniplanar coil. With the assist of the stream function technique, the continuous current densities for the two coils can be approximated by a 10 discrete loops with a common current of 316.1 Amps (FIG. 10). Table 16 illustrates all the vital characteristics needed for the engineering and manufacturing phase of such a gradient coil.

TABLE 16

| Non-Shielded Z Uniplanar Gradient Coil | |
| --- | --- |
| Property | |
| Gradient Strength at mT/m/100 A | 12.65 mT/m/100 A |
| Gradient Strength at 500 A | 63.25 mT/m |
| 450 A | 56.93 mT/m |
| 330 A | 41.75 mT/m |
| Number of Discrete Loops | 13 |
| Cu thick. between adjacent loops | >12.5 mm |
| Total Inductance (cable included) | 241 μH |
| Total Resistance (Cable included) | 57 mΩ |
| Rise Time at 2000 V/500 A | 62 μsec |
| 700 V/450 A | 160 μsec |
| 400 V/330 A | 209 μsec |
| Linear Slew Rate at 2000 V/500 A | 1034 T/m/sec |
| 700 V/450 A | 354 T/m/sec |
| 400 V/330 A | 200 T/m/sec |
| Duty Cycle (RMS Gradient) | |
| (500 A ref. point) at 4500 kW | 63% of the peak gradient(40.0 mT/m) |
| at 2000 kW | 42% of the peak gradient(26.7 mT/m) |
| at 1000 kW | 30% of the peak gradient(18.9 mT/m) |

4) Shielded Uniplanar Gradient Coils i) Transverse (X,Y) Uniplanar Gradient Coil with Parabolic Cut-offs:

For the shielded transverse biplanar gradient coils, the gap between the geometric center of the entire gradient structure and the planar surface of the primary coil is chosen to be −a'=−6 mm. The gap between the geometric center of the structure and the planar surface of the shielding coil is chosen to be −b'=−70 mm. The constraint points for the minimization algorithm are shown in Table 17. The gradient field at the center of the structure is demanded to be 40 mT/m with 20% on axis linearity at a distance of +200 mm from the center of the gradient. In addition, the off-axis uniformity of the gradient field is restricted to within 20% from the field's ideal value inside a 25 cm Diameter Spherical Volume (DSV).

TABLE 17

Constraints for a Shielded Uniplanar transverse(X,Y) gradient coils

| Xj in meters | Yj in meters | Zj in meters | Bzscj in Tesla |
|---|---|---|---|
| 0.000 | 0.001 | 0.075 | 0.0000400 |
| 0.000 | 0.100 | 0.075 | 0.0040000 |
| 0.000 | 0.300 | 0.075 | 0.0140400 |
| 0.180 | 0.001 | 0.075 | 0.0000380 |
| 0.000 | 0.001 | 0.13 | 0.0000390 |
| 0.000 | 0.001 | 0.180 | 0.0000320 |

Figure 11A:
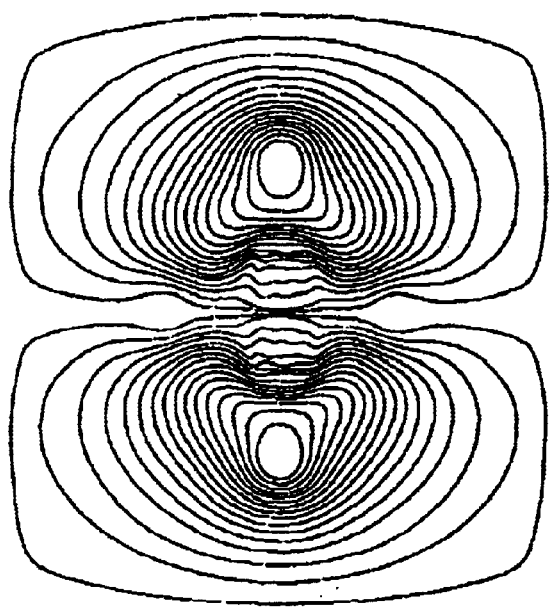
FIG. 11a is a gradient pattern.
Figure 11B:
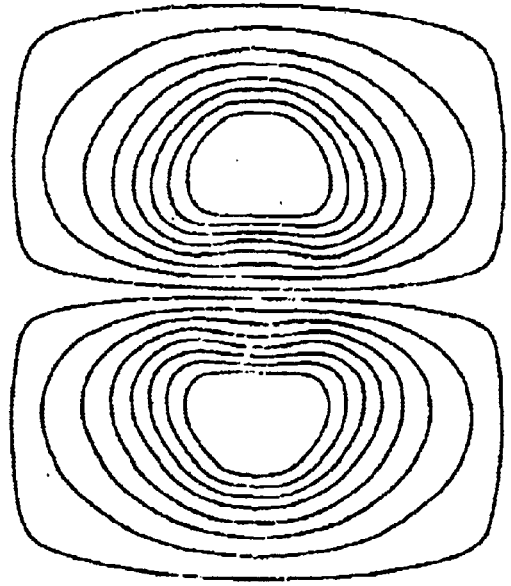
FIG. 11b is a gradient pattern.

The application of the Lagrange minimization technique to the set of constraints of the Table 17 generates a continuous current distribution for primary coil of the Transverse Shielded Y biplanar coil. With the assist of the stream function technique, the continuous current densities for the primary coil can be approximated by a 16 discrete loops with a common current of 324.17 Amps (FIG. 11a), while for the secondary coil its continuous current density can be approximated by 8 loops (FIG. 11b) with the same constant current as the primary coils. Table 18 illustrates all the vital characteristics needed for the engineering and manufacturing phase of such a gradient coil.

TABLE 18

Shielded Transverse (X,Y) Uniplanar Gradient Coil

| Property | |
|---|---|
| Gradient Strength at mT/m/100 A | 12.33 mT/m/100 A |
| Gradient Strength at 500 A | 61.69 mT/m |
| 450 A | 55.52 mT/m |
| 330 A | 40.70 mT/m |
| Number of Discrete Loops | 16/8 |
| Cu thick. between adjacent loops | 12.4 mm/15.8 mm |
| Total Inductance (cable included) | 302 $\mu$H |
| Total Resistance (Cable included) | 122 m$\Omega$ |
| Rise Time at 2000 V/500 A | 78 $\mu$sec |
| 700 V/450 A | 210 $\mu$sec |
| 400 V/330 A | 277 $\mu$sec |
| Slew Rate at 2000 V/500 A | 792 T/m/sec |
| 700 V/450 A | 264 T/m/sec |
| 400 V/330 A | 147 T/m/sec |
| Duty Cycle (RMS Gradient) | |
| (500 A ref. point) at 4500 kW | 40% of the peak gradient(24.95 mT/m) |
| at 2000 kW | 27% of the peak gradient(16.64 mT/m) |
| at 1000 kW | 19% of the peak gradient(11.76 mT/m) |
| % Eddy Currents at 25 cm DSV | 0.39% | iii) Axial Z Biplanar Gradient Coil:

For the shielded Axial Uniplanar gradient coils, the gap between the geometric center of the entire gradient structure and the planar surface of the primary coil is chosen to be $-a'=-6$ mm. The gap between the geometric center of the structure and the planar surface of the shielding coil is chosen to be $-b'=-70$ mm. The constraint points for the minimization algorithm are shown in Table 19. The gradient field at the center of the structure is demanded to be 40 mT/m with 20% on axis linearity at a distance of ±130 mm from the center of the gradient and 7.5% of f axis uniformity inside a 25 cm Diameter Spherical Volume (DSV).

TABLE 19

Constraints for a Shielded Uniplanar Z gradient coil

| Xj in meters | Yj in meters | Zj in meters | Bzscj in Tesla |
|---|---|---|---|
| 0.000 | 0.000 | 0.031 | 0.0000400 |
| 0.000 | 0.000 | 0.231 | 0.0062800 |
| 0.180 | 0.000 | 0.031 | 0.00003600 |
| 0.000 | 0.200 | 0.031 | 0.00003200 |

Figure 12A:
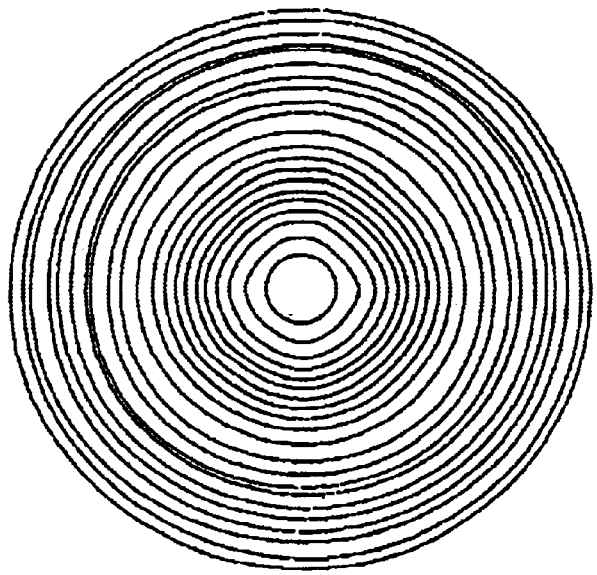
FIG. 12a is a gradient pattern.
Figure 12B:
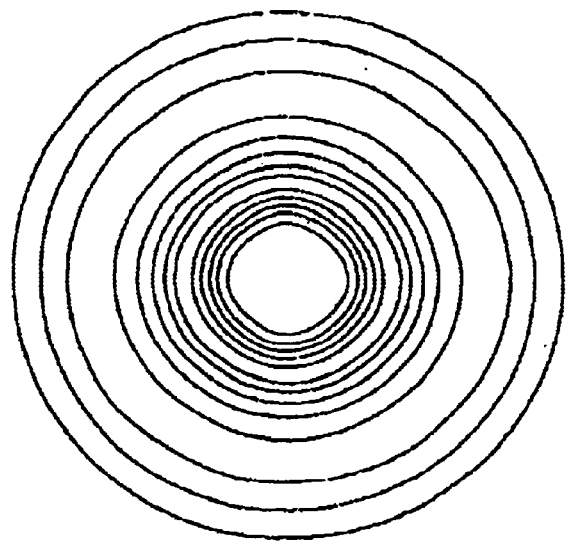
FIG. 12b is a gradient pattern.

The application of the Lagrange minimization technique to the set of constraints of the Table 19, generates a continuous current distribution for primary coil of the Axial Shielded Z biplanar coil. With the assist of the stream function technique, the continuous current densities for the primary coil can be approximated by 21 discrete loops with a common current of 385.71 Amps (FIG. 12a). The continuous current density for the shielding coil can be approximated by 13 discrete loops (FIG. 12b) Table 20 illustrates all the vital characteristics needed for the engineering and manufacturing phase of such a gradient coil.

TABLE 12

Shielded Z Uniplanar Gradient Coil

| Property | |
|---|---|
| Gradient Strength at mT/m/100 A | 10.37 mT/m/100 A |
| Gradient Strength at 500 A | 51.85 mT/m |
| 450 A | 46.67 mT/m |
| 330 A | 34.22 mT/m |
| Number of Discrete Positive Loops | 21/13 |
| Cu thick. between adjacent loops | 9.4 mm/15.8 mm |
| Total Inductance (cable included) | 306 $\mu$H |
| Total Resistance (Cable included) | 125 m$\Omega$ |
| Rise Time at 2000 V/500 A | 80 $\mu$sec |
| 700 V/450 A | 213 $\mu$sec |
| 400 V/330 A | 281 $\mu$sec |
| Slew Rate at 2000 V/500 A | 656 T/m/sec |
| 700 V/450 A | 218 T/m/sec |
| 400 V/330 A | 122 T/m/sec |
| Duty Cycle (RMS Gradient) | |
| (500 A ref. point) at 4500 kW | 40% of the peak gradient(20.97 mT/m) |
| at 2000 kW | 27% of the peak gradient(13.98 mT/m) |
| at 1000 kW | 19% of the peak gradient(9.89 mT/m) |
| % Eddy Currents at 25 cm DSV | 0.19% |

Mutual Inductance Calculations
Biplanar Gradients

The mutual energy between two biplanar gradients of the same axis was evaluated based on the equations (64) and (65). In particular for this example the mutual energy between two biplanar transverse Y gradients was evaluated. For the first biplanar set, the gap between its primary planes was set at 2a=288 mm, while the gap between its shielding planes was set at 2b=341 mm. For the second biplanar set, the gap between the primary planes was set at $2\bar{a}$=282mm, while the gap between the two secondary planes is set at $2\bar{b}$=292 mm. The mutual energy of these two sets as a function of shifting one set with respect to the other along the z direction. The optimum (zero) mutual energy of these two sets occurs at the point $z_0$=216 mm from the geometric center of the fir gradient coil set.

Uniplanar Gradients

The mutual energy between two uniplanar gradients of the same axis was evaluated based on the equations (21). In particular for this example the mutual energy between two uniplanar axial Z gradients was evaluated. For the first uniplanar set, the gap on the primary plane was set at −a'=−6 mm, while the gap of the shielding plane was set at −b'=−70 mm. For the second biplanar set, the gap for the primary plane was set at −ā'=−3 mm, while the gap between the two secondary planes is set at −b̄'=−75 mm. The optimum (zero) mutual inductance for these two set occurs at the point $z_0$=245 mm from the geometric center of the first gradient coil set.

The present invention describes a method of designing and manufacturing an Open Architecture gradient coil set which is suitable for magnetic resonance systems with vertically directed or horizontally directed fields. The concept of designing of an open architecture gradient coil system offer a significant advantage over existing geometries since, the present gradient design provides superior performance in terms of gradient strength and field linearity and uniformity while the structure of the coil is an open architecture focusing of reducing patient claustrophobia. The invention can be implemented in gradient coil designs for open magnet geometries with either vertically and or horizontally directed fields. In particular, for magnets with vertically directed fields, besides the open architecture design of the proposed gradient system a significant gradient increase in the strength of the local gradient field up to 55 mT/m with slew rates exceeding 1000 T/m/sec in an imaging volume covering the size of the human head (25 cm DSV). Another significant advantage of the design is the ability to control and minimize the dB/dt and eddy current levels for shielded design. In addition, the open architecture design can be paired in a phased array configuration with alternative shielded or not open architecture gradient coil set in such a configuration that covers the human body head to toe. The significant advantage of such configuration is the significant reduction of dB/dt effects and the utilization of high strength non-claustrophobic gradient coils for high speed imaging of the human body with excellent gradient field uniformity and linearity characteristics in the local predetermined gradient volume. For open magnets with horizontally directed fields (double-donut designs), the invention provides a competitive advantage over existing gradient designs since it can deliver gradient fields with strengths two to three fold greater than already existing designs and the ability to cover the entire human body in a phased array configuration with minimized dB/dt effects and induced eddy currents on the magnet's shields or metallic surfaces during the localization of the gradient field. The open architecture can be modified with parabolic cut-offs in order to incorporate the human shoulders for the portion of the open architecture gradient system which is suitable for imaging the human head. Furthermore, the design can be incorporated as an insertable configuration and can be fully integrated with any volumetric or surface phased array or singular coil configuration for imaging portions or the entire human body. In another aspect of the invention the design can be secured into the structure of its corresponding design. Although the design incorporates a limited curvature for the perspective gradient coil configurations, the curvature can be easily modified for those skilled to the art to any unspecified shape suitable for the any targeted application. In addition, for a self-shielded design the side planes of the secondary (shielded) coil can be mechanically shifted and can be adjusted with respect the primary planes of the coil in an array configuration with zero mutual inductance in such a way that the imaging volume of the coil is extended.

The present invention provides a gradient coil set that minimizes patient anxiety while delivering high peak, uniformity and slew rate gradient coils for Large imaging volumes. The combination of both biplanar and uniplanar gradients achieve a gradient magnetic field with superior field qualities. The coil set may have the side planes with parabolic cut offs in order to assist in patient comfort for applications that are focused on imaging the head, the neck, the spine, the heart and the upper torso area Due to the phased array design low dB/dt levels can be achieved. In the gradient coil set and especially for the shielded designs, the outer shielding planes can be moved to form a phased array configuration with their perspective primary planes corresponding to the same gradient coil axis. The movement can be done via mechanical means or any other means. An unlimited spectrum of FMRI and Interventional applications can be performed with the he "Open Face Architecture" gradient coil, because of its openness and the high peak and slew rate values for the gradient field.

Referring to FIG. 1, a gradient coil set 10 includes a uniplanar Z-gradient coil 12 and a biplanar X-gradient coil 14 and a biplanar Y-gradient coil 16. Each of coils may include a respective shield coil 18, 20, 22. The coil set 10 has an open Z-axis face opposite the coil 12. The biplanar coils may be provided with shoulder reliefs 24. The structure of the biplanar coils 14, 16 may be conjoined with the structure of the uniplanar coil 12, for example, as shown.

Figure 13:
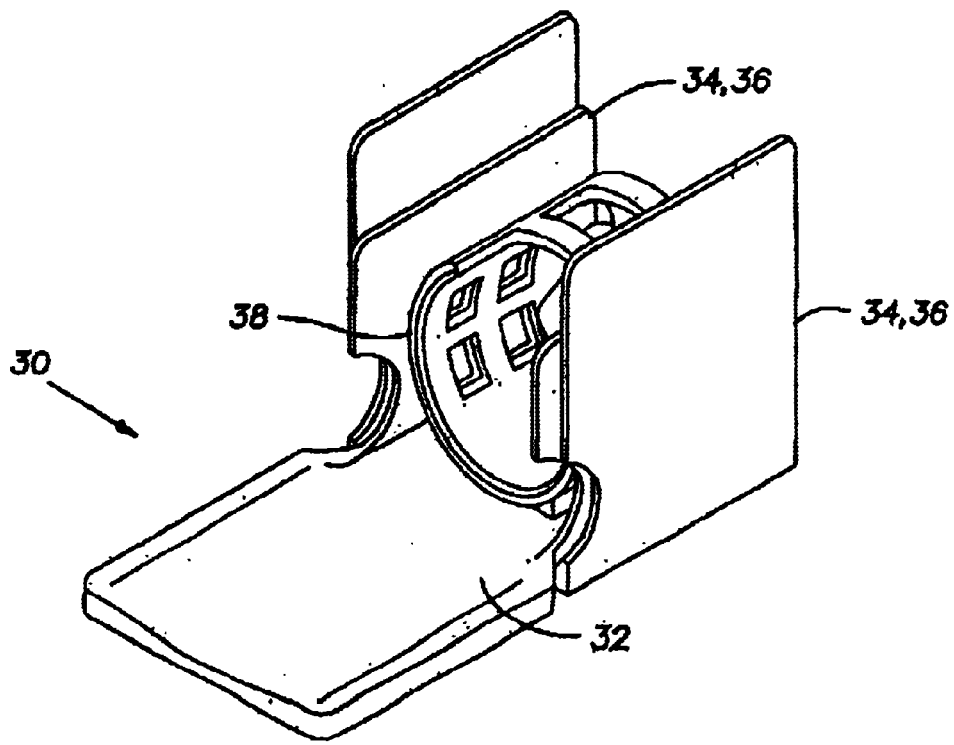
FIG. 13 is a perspective view of a possible gradient coil set according to the invention with shielded biplanar coils.

Referring to FIG. 13, a gradient coil set 30 includes self-shielded gradient coils 32, 34, 36 and a RF head coil 38

Figure 14:
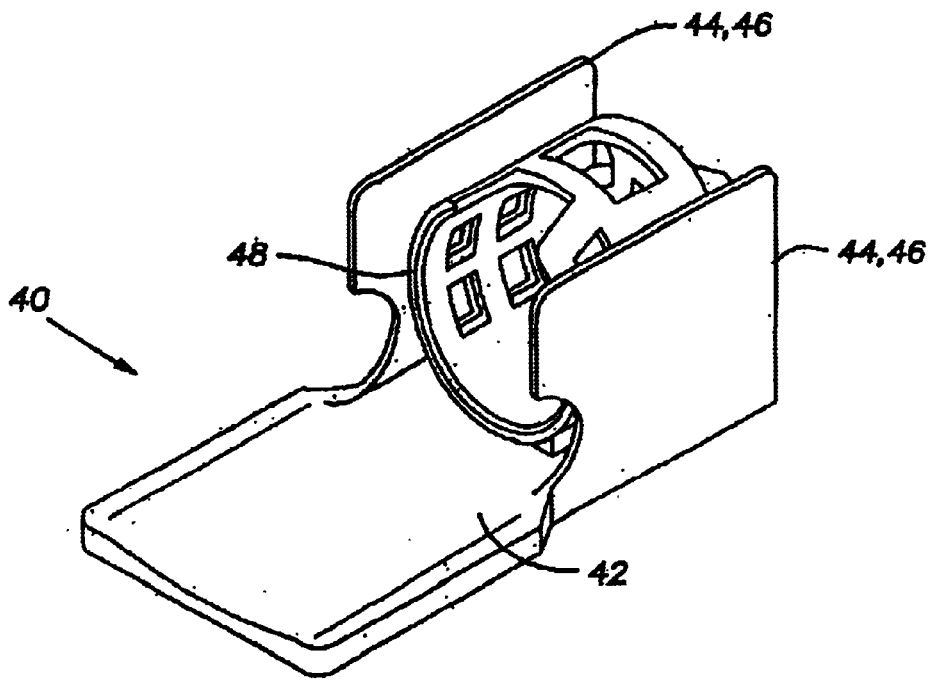
FIG. 14 is a perspective view of a possible gradient coil set according to the invention with unshielded biplanar coils.

Referring to FIG. 14, a gradient coil set 40 includes un-shielded gradient coils 42, 44, 46 and a RF head coil 48.

Figure 15:
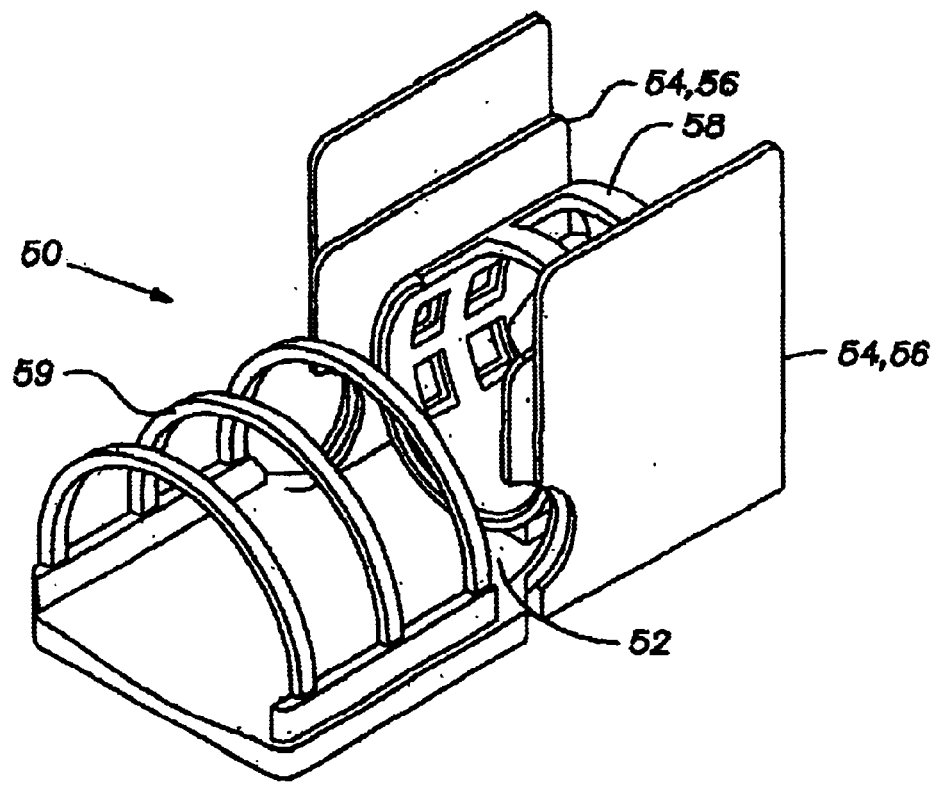
FIG. 15 is a perspective view of a possible gradient coil set according to the invention with shielded biplanar coils and incorporating radio frequency coils.

Referring to FIG. 15, a gradient coil set 50 includes self-shielded gradient coils 52, 54, 56, a RF head coil 58 and a CTL spine coil 59 integrated into the structure of the gradient coil set 50.

Figure 16:
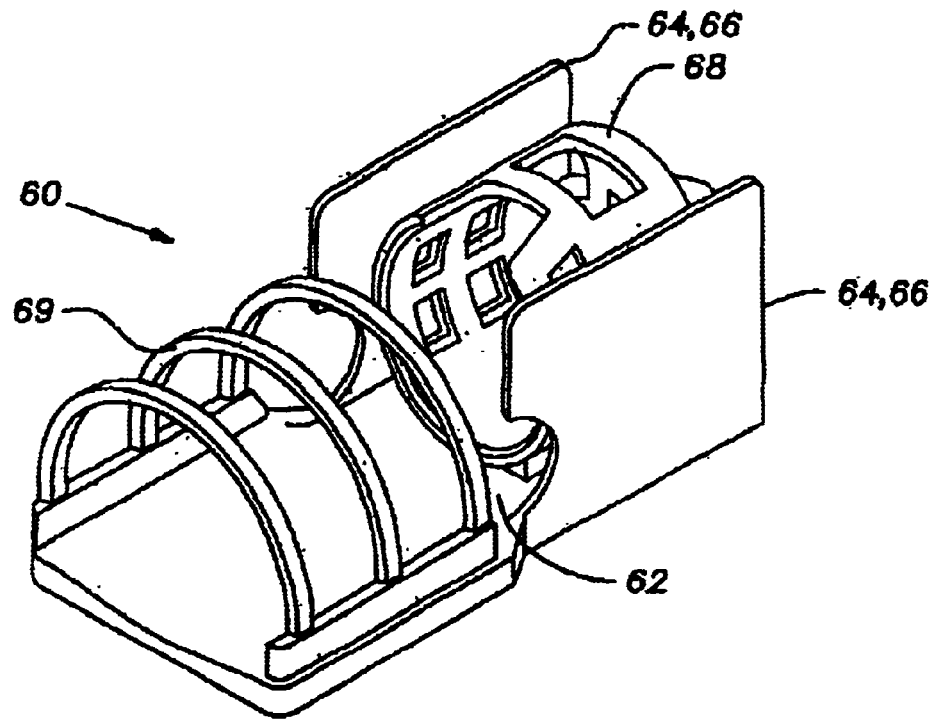
FIG. 16 is a perspective view of a possible gradient coil set according to the invention with unshielded biplanar coils and incorporating radio frequency coils.

Referring to FIG. 16, a gradient coil set 60 includes un-shielded gradient coils 62, 64, 66, a RF head coil 68 and a CTL spine coil 69 integrated into the structure of the gradient coil set 60.

Figure 17:
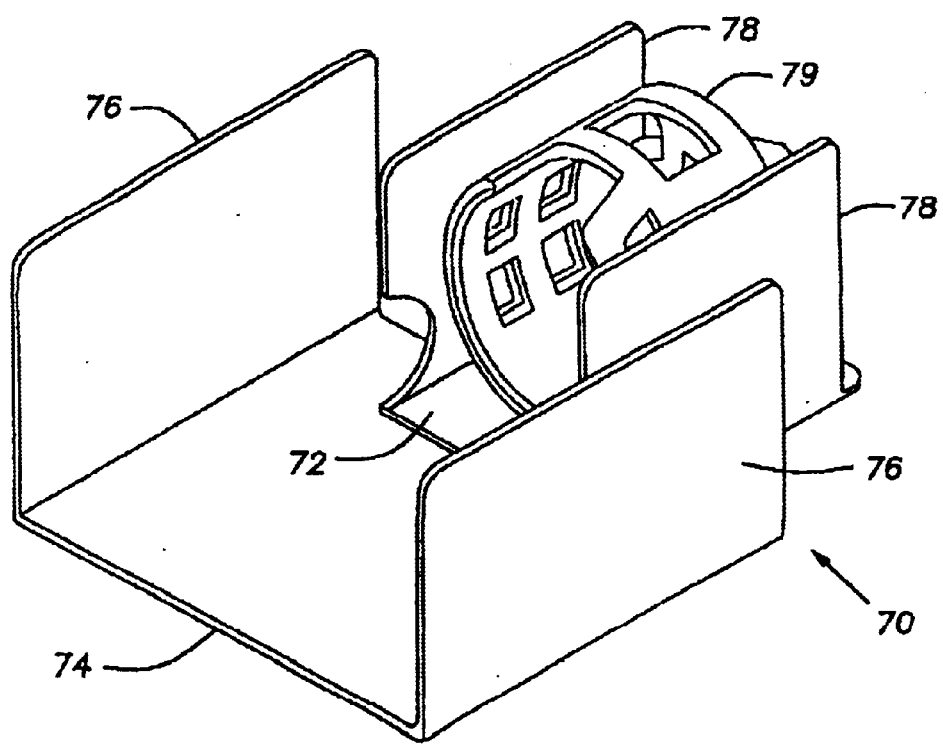
FIG. 17 is a perspective view of a possible gradient coil set according to the invention in an array configuration.

Referring to FIG. 17, a gradient coil set 70 includes Z-gradient uniplanar coils 72, 74 and X-Y biplanar gradient coils 76, 78 in a phased array configuration. A head RF coil 79 may be included.

Figure 18:
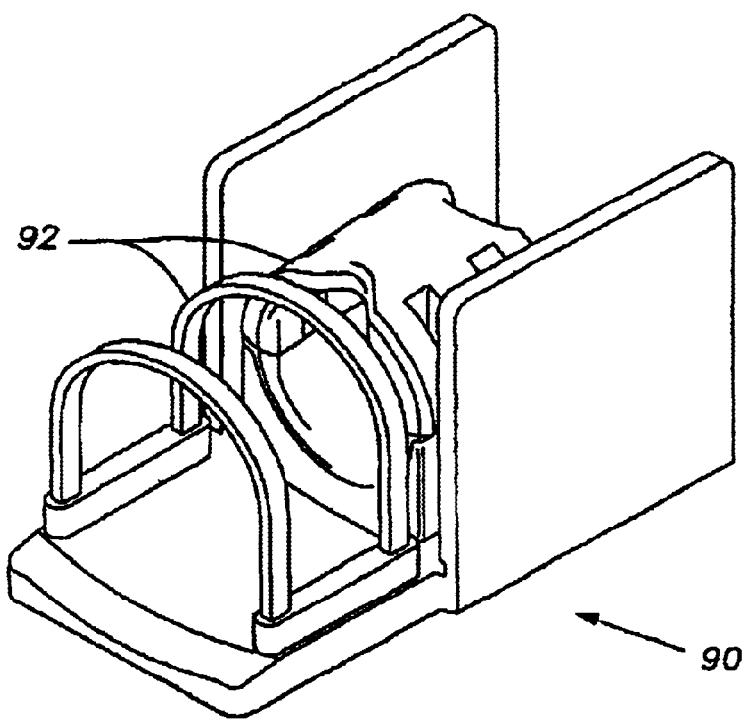
FIG. 18 is a perspective view of a possible gradient coil set according to the invention incorporating knee and upper thigh frequency coils.

Referring to FIG. 18, an open Z-axis face coil set 90 includes a knee and upper thigh RF coil 92 integrated therewith.

Figure 19:
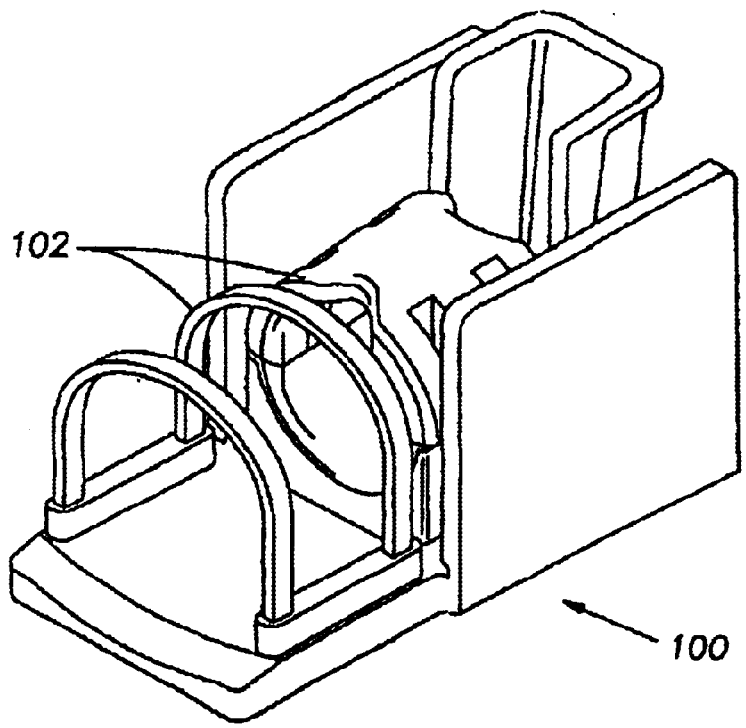
FIG. 19 is a perspective view of a possible gradient coil set according to the invention incorporating knee and foot radio frequency coils.

Referring to FIG. 19, an open Z-axis face coil set 100 includes a knee and foot RF coil 102 integrated therewith.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. An open MRI gradient coil set for imaging an object, said coil set comprising:

a uniplanar Z-gradient coil configured to extend along the longitudinal axis of an object;

a biplanar X-gradient coil extending perpendicularly to said uniplanar Z-gradient coil in each of a first plane and a second plane; and a biplanar Y-gradient coil extending perpendicularly to said uniplanar Z-gradient coil in each of the first plane and the second plane, the first plane and the second plane being generally parallel to one another and separated by a gap, wherein said coils are configured to allow insertion of at least a portion of the object in the gap between the first plane and the second plane having said biplanar X-gradient and Y-gradient coils, and said coil set together forming an open Z-axis face opposite said Z-gradient coil, said open Z-axis face extending the length of the longitudinal axis.

2. A coil set according to claim 1, wherein at least one of said coils is a shielded coil.

3. A coil set according to claim 1, wherein said biplanar coils include shoulder reliefs.

4. A coil set according to claim 1, wherein at least one of said coils is a phased array coil.

5. A coil set according to claim 1, further comprising a radio frequency coil integrated within the gap.

6. A coil set according to claim 1, wherein said coils are conjoined.

7. A coil set according to claim 1, wherein said gradient coils are configured to image a human head.

8. A coil set according to claim 1, wherein said biplanar X-gradient and Y-gradient coils are configured to be positioned adjacent sides of a human head when imaging the human head.

9. A coil set according to claim 1, wherein the open Z-axis face is configured to allow a non-disrupted view by a human subject, during imaging of the human subject.

10. A coil set according to claim 1, wherein the gradient coils comprise an insertable configuration configured to be integrated with one of a volumetric, surface phased array and singular coil arrangement.

11. A coil set according to claim 1, wherein at least one of said gradient coils is configured to be integrated with one of a knee, upper thigh and foot RF coil.

12. An insertable open gradient coil set for magnetic resonance imaging, said gradient coil set comprising:

a Z-gradient coil positioned substantially in parallel with the main magnet poles of a magnetic resonance imaging system and configured to be positioned along a length of an object being imaged;

an X-gradient coil positioned substantially perpendicular to the main magnet poles, said X-gradient coil configured in perpendicular arrangement to said Z-gradient coil and configured to be positioned along each of a first side and a second side of the object; and a Y-gradient coil configured in a biplanar arrangement with said X-gradient coil, said Y-gradient coil configured in perpendicular arrangement to said Z-gradient coil and configured to be positioned along each of the first side and the second side of the object, the first side and the second side having said X-gradient and Y-gradient coils defining a gap therebetween configured to allow insertion of at least a portion of the object, said coils forming a unitary construction having a Z-axis opening opposite said Z-gradient coil and configured to extend along the length of the object being imaged, the unitary construction being insertable within the magnetic resonance imaging system.

13. A coil set according to claim 12, wherein the open Z-axis face is configured to allow a non-disrupted view by a human subject, during imaging of the human subject.

14. A coil set according to claim 12, wherein said object is a patient, said X-gradient and Y-gradient coils each comprise a parabolic cut-off, and wherein said parabolic cut-offs are configured to receive the shoulders of the patient.

15. A coil set according to claim 14, wherein said parabolic cut-offs are configured in a symmetric arrangement and positioned at a lower end of each of the X-gradient coil and Y-gradient coil.

16. A coil set according to claim 12, further comprising at least one set of additional gradient coils in combination with at least one of said X-gradient, Y-gradient, and Z-gradient coils, together forming an array configured to extend imaging coverage of the coil set.

17. A coil set according to claim 12, wherein said gradient coils are configured to operate in connection with the magnetic resonance imaging system to image at least one of a head, knee, upper thigh and foot of the object.

18. A method for magnetic resonance imaging, said method comprising:

configuring a Z-gradient coil to extend along the longitudinal axis of an object and substantially perpendicular to a pair of biplanar X-gradient and Y-gradient coils; and configuring said biplanar X-gradient and Y-gradient coils in a parallel arrangement, said biplanar X-gradient and Y-gradient coils each extending in each of a first plane and a second plane substantially perpendicular to said Z-gradient coil and spaced apart to allow insertion therebetween of at least a portion of the object, said coils together forming a Z-axis opening opposite said Z-gradient coil, said Z-axis opening extending the length of the longitudinal axis.

19. A method according to claim 18, wherein the object is a patient, and further comprising a parabolic cut-off in each of the X-gradient and Y-gradient coils to receive the shoulders of the patient.

* * * * *